(12) United States Patent
Meng et al.

(10) Patent No.: US 7,362,602 B1
(45) Date of Patent: Apr. 22, 2008

(54) SENSE AMPLIFIER CIRCUIT AND METHOD

(75) Inventors: Anita X. Meng, Los Altos, CA (US); Hariom Rai, Santa Clara, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/501,584

(22) Filed: Aug. 8, 2006

Related U.S. Application Data

(60) Provisional application No. 60/706,275, filed on Aug. 8, 2005.

(51) Int. Cl.
*G11C 7/00* (2006.01)

(52) U.S. Cl. .......................................... 365/49; 365/207
(58) Field of Classification Search ................. 365/204
See application file for complete search history.

(56) References Cited

U.S. PATENT DOCUMENTS

| | | | |
|---|---|---|---|
| 5,459,416 A * | 10/1995 | Ghia et al. ..................... 327/34 |
| 6,081,440 A | 6/2000 | Washburn et al. |
| 6,108,227 A | 8/2000 | Voelkel |
| 6,191,970 B1 | 2/2001 | Pereira |
| 6,240,000 B1 | 5/2001 | Sywyk et al. |
| 6,243,280 B1 | 6/2001 | Wong et al. |
| 6,253,280 B1 | 6/2001 | Voelkel |
| 6,262,907 B1 | 7/2001 | Lien et al. |
| 6,266,262 B1 | 7/2001 | Washburn et al. |
| 6,420,990 B1 | 7/2002 | Voelkel |
| 6,480,406 B1 | 11/2002 | Jin et al. |
| 6,502,163 B1 | 12/2002 | Ramankutty |
| 6,504,740 B1 | 1/2003 | Voelkel |
| 6,505,270 B1 | 1/2003 | Voelkel et al. |
| 6,647,457 B1 | 11/2003 | Sywyk et al. |
| 6,661,716 B1 | 12/2003 | Sywyk et al. |
| 6,697,275 B1 | 2/2004 | Sywyk et al. |
| 6,721,202 B1 | 4/2004 | Roge et al. |
| 6,751,755 B1 | 6/2004 | Sywyk et al. |
| 6,760,241 B1 | 7/2004 | Gharia |
| 6,760,242 B1 | 7/2004 | Park et al. |
| 6,763,426 B1 | 7/2004 | James et al. |
| 6,772,279 B1 | 8/2004 | Sun et al. |
| 6,804,134 B1 | 10/2004 | Proebsting et al. |
| 6,804,744 B1 | 10/2004 | Abbas |
| 6,845,024 B1 | 1/2005 | Wanzakhade et al. |
| 6,876,558 B1 | 4/2005 | James et al. |
| 6,892,273 B1 | 5/2005 | James et al. |

(Continued)

OTHER PUBLICATIONS

U.S. Appl. No. 10/180,357, Richard Chou.

(Continued)

*Primary Examiner*—Tan T. Nguyen
(74) *Attorney, Agent, or Firm*—Haverstock & Owens, LLP

(57) ABSTRACT

A sense amplifier circuit can be coupled to a match line for receiving a match line voltage and to a low potential line for receiving a low potential voltage from a memory array. The sense amplifier circuit can include a charging circuit coupled between a power supply voltage and the match line voltage that comprises no p-channel transistors. A discharging circuit can be coupled between the low potential voltage and a ground supply voltage. An n-channel sensing device can coupled to detect a potential difference between the match line voltage and the low potential voltage.

20 Claims, 10 Drawing Sheets

U.S. PATENT DOCUMENTS

| | | |
|---|---|---|
| 6,903,951 B1 | 6/2005 | James |
| 6,906,936 B1 | 6/2005 | James |
| 6,954,823 B1 | 10/2005 | James |
| 6,958,925 B1 | 10/2005 | Om et al. |
| 6,988,164 B1 | 1/2006 | Wanzakhade et al. |
| 7,000,066 B1 | 2/2006 | Wanzakhade et al. |
| 7,019,999 B1 | 3/2006 | Srinivasan et al. |
| 7,084,672 B1 * | 8/2006 | Meng et al. .................. 327/51 |

OTHER PUBLICATIONS

U.S. Appl. No. 10/197,298, Sun et al.
U.S. Appl. No. 10/202,526, Janet Zou.
U.S. Appl. No. 10/209,142, James et al.
U.S. Appl. No. 10/217,746, Richard Chou.
U.S. Appl. No. 10/264,667, David James.
U.S. Appl. No. 10/266,953, Sanjay Wanzakhade.
U.S. Appl. No. 10/271,660, David James.
U.S. Appl. No. 10/281,814, David James.
U.S. Appl. No. 10/329,146, James et al.
U.S. Appl. No. 10/897,062, Srinivasan Venkatachary.
U.S. Appl. No. 10/930,138, Anita X. Meng.
U.S. Appl. No. 10/931,960, Bettman et al.
U.S. Appl. No. 10/940,129, Steven Narum.
U.S. Appl. No. 10/948,050, Venkatachary et al.
U.S. Appl. No. 10/950,323, Birman et al.
U.S. Appl. No. 10/977,516, Hari Om.
U.S. Appl. No. 11/000,568, Scott Smith.
U.S. Appl. No. 11/011,464, Scott Smith.
U.S. Appl. No. 11/014,123, Om et al.
U.S. Appl. No. 11/043,391, Pankaj Gupta.
U.S. Appl. No. 11/047,793, Gupta et al.
U.S. Appl. No. 11/085,399, Hari Om.
U.S. Appl. No. 11/089,837, Scott Smith.
U.S. Appl. No. 11/090,116, Banachowicz et al.
U.S. Appl. No. 11/146,639, Dinesh Maheshwari.
U.S. Appl. No. 11/207,323, Srinivasan Venkatachary.
U.S. Appl. No. 11/219,109, Dinesh Maheshwari.
"A Ternary Content-Addressable Memory (TCAM) Based on 4T Static Storage and Including Current-Race Sensing Scheme" IEEE Journal of Solid-State Circuits, vol. 38, No. 1, Jan. 2003, pp. 155-158 by Arsovski et al.
"A Current-Saving Match-Line Sensing Scheme for Content-Adressable Memories" ISSCC 2003, Session 17, SRAM and DRAM, Paper 17.3 by Arsovski et al., pp. 304-305.

* cited by examiner

SENSE AMPLIFIER CIRCUIT AND METHOD

This application claims the benefit of U.S. Provisional Patent Application Ser. No. 60/706,275, Filed Aug. 8, 2005, the contents of which are incorporated by reference herein.

BACKGROUND OF THE INVENTION

1. Field of the Invention

This invention relates to sense amplifier circuits and, more particularly, to sense amplifier circuits that detect a potential difference between two nodes.

2. Description of the Related Art

The following descriptions and examples are given as background only.

Sense amplifiers are commonly used in memory devices, such as random access memories (RAMs), read only memories (ROMs), and more specialized memories, such as content addressable memories (CAMs).

Continuing goals for nearly all integrated circuits include lower power consumption, higher operating speeds, and lower operating voltages. In the particular case of CAM devices, sensing operations can consume a considerable amount of current (and hence power), as such operations typically involve the continuous charging of multiple match lines, and the subsequent discharging of select match lines. Sense amplifier circuits are usually connected to such match lines to detect a match line state following a compare operation. For some conventional CAMs, a match line representing a match result (i.e., a HIT) will remain charged, while a match line representing a mismatch result (i.e., a MISS) is discharged to (or at least toward) a relatively low voltage power supply (e.g., Vss).

One conventional sense amplifier circuit is disclosed in "A Ternary Addressable Memory (TCAM) Based on 4T Static Storage and Including Current-Race Sensing Scheme," IEEE Journal of Solid-State Circuits, Vol. 38, No. 1, January 2003, pp. 155-158 by Arsovski et al. Another conventional sense amplifier circuit is shown in "A Current-Saving Match-Line Sensing Scheme for Content-Addressable Memories," ISSCC 2003, Session 17, SRAM and DRAM, Paper 17.3 by Arsovski et al, pp. 304-305.

Yet another conventional sense amplifier is shown in FIG. 10. FIG. 10 shows an example of a single-ended sense amplifier employed in a ternary CAM device. In FIG. 10, sense amplifier 1000 is coupled to a compare stack 1002. Compare stack 1002 represents one of many bit compares in a sense operation. For example, bit compares may compare a compare data value (represented by complementary values CD and BCD) to a data value (represented by complementary values D and BD). In some cases, a compare result is maskable by a mask value MASK. Such masking capability is used to form a Mask-Value "ternary" CAM device, as opposed to a binary CAM device.

As shown in FIG. 10, conventional sense amplifier 1000 includes p-channel precharge transistors P1 and P2 having sources commonly connected to a power supply voltage (e.g., VCC), and gates commonly connected to a precharge signal (PRECHG). The conventional sense amplifier 1000 also includes a holding n-channel transistor N1 and sensing n-channel transistor N2. Transistors N1 and N2 may have drains connected to the drains of transistors P1 and P2, respectively. The sources of transistors N1 and N2 can be commonly connected to a match line 1004. The gates of transistors N1 and N2 can be commonly connected to another voltage (VCCQ). The VCCQ voltage may be included to maintain transistors N1 and N2 in an "off" state when match line 1004 is precharged to a high voltage potential, as will be described below.

The drain-drain connection of transistors P2 and N2 are connected to sense node 1006. Sense node 1006 can be precharged to a high precharge voltage (e.g., VCC) by precharge p-channel transistors P2. The potential at sense node 1006 can be buffered by series connected inverters INV1 and INV2 to provide the sense amplifier output signal (SAOUT). If p-channel P4 gate is connected to the bmsa node, the P4 gate can be (optionally) turned off by connecting it to the supply voltage (e.g. Vcc). P-channel transistors P3 and P4 are arranged in series forming a weak ½ latch between sense node 1006 and supply voltage VCC.

The operation of sense amplifier 1000 will now be described. In a pre-sense period, match line 1004 can be precharged to VCC-Vtn1, where Vtn1 is the threshold voltage of holding transistor N1. It is noted that sensing transistor N2 is designed to have a higher threshold voltage (e.g., at least 200 mV) than holding transistor N1. Thus, once match line 1004 is precharged to VCC-Vtn1, sensing transistor N2 is turned off.

In a sense period, data values (e.g., D and BD) can be compared to compare data (e.g., CD and BCD) within compare stack 1002. If the sense operation indicates a match (e.g., a HIT), all compare stacks (e.g., multiple compare stacks connected to match line 1004) will maintain a relatively high impedance between the match line 1004 and ground (VSS). In this state, sense amplifier 1000 utilizes the difference in threshold voltages of transistors N1 and N2 to keep transistor N2 in the "off" state. With transistor N2 turned off, sense node 1006 can be maintained at the relatively high precharged potential (e.g., VCC). In enabled, the weak ½ latch formed by p-channel devices P3 and P4 will also help to maintain sense node 1006 at its high voltage potential. This enables the sense amplifier output signal (SAOUT) to remain high, indicating a HIT state.

If the sense operation indicates a mis-match (e.g., a MISS), at least one compare stack will provide a relatively low impedance path between the match line 1004 and ground (VSS), causing match line 1004 to be discharged toward ground. When the gate to-source voltage of transistor N2 becomes larger than Vtn2, the sense transistor N2 will turn on. With transistor N2 on, sense node 1006 will discharge through sense transistor N2 and the compare stack 1002 to ground (VSS). This enables the sense amplifier output signal (SAOUT) to transition low, indicating a MISS state.

Thus, sense amplifier 1000 generally operates by pre-charging match line 1004 to VCC-Vtn1, and then discharging the same match line in the event of a MISS state. It is understood that a conventional CAM includes numerous match lines, and in a given sense operation, MISS states are far more common than HIT states. As a result, match operations in conventional sense amplifier circuits tend to consume considerable amounts of current, as match lines are continuously precharged and discharged

BRIEF DESCRIPTION OF THE DRAWINGS

Other objects and advantages of the invention will become apparent upon reading the following detailed description and upon reference to the accompanying drawings in which.

Figure 1:
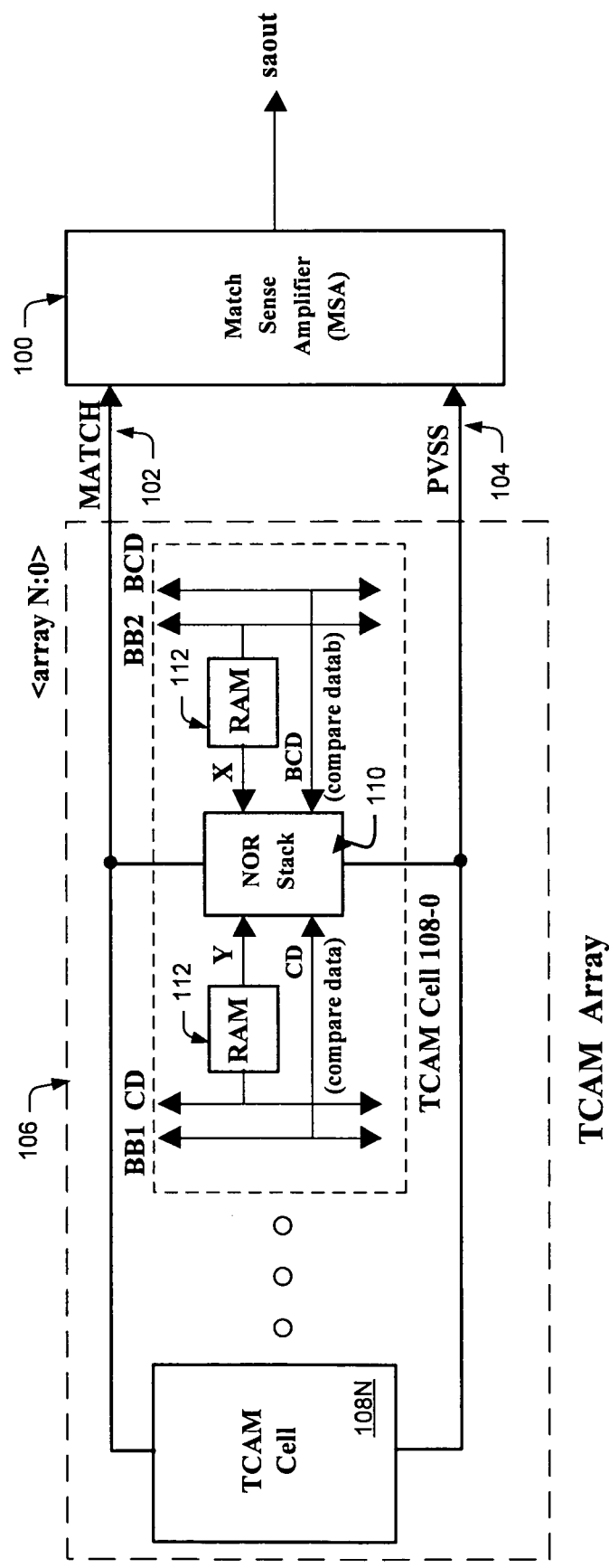
FIG. 1 is a block diagram of a content addressable memory (CAM) device according to one embodiment of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

To reduce overall current consumption, a sense amplifier circuit may operate in conjunction with a "pseudo-supply" arrangement. A pseudo-VSS arrangement can include a pseudo-VSS node that is preset (i.e., pre-discharged) to a predetermined value (e.g., VSS). As will be described more detail below, such an arrangement utilizes a charge sharing mechanism that functions to conserve charge on a match line, thus reducing overall current consumption in the sense amplifier circuit.

Various examples of a content addressable memory (CAM) including a pseudo-VSS arrangement are shown in U.S. Pat. No. 6,515,884 to Sywyk et al. U.S. Pat. No. 6,515,884 shares a common assignee with the present invention and is incorporated herein in its entirety. However, the examples disclosed in U.S. Pat. No. 6,515,884 should not be construed as limiting to the present invention.

FIG. 1 shows a memory architecture including a CAM device and a single-ended sense amplifier with a pseudo-VSS arrangement. As shown in FIG. 1, sense amplifier 100 can receive, as inputs, a match line 102 and a pseudo-VSS line 104. Match line 102 can provide a MATCH signal indicating whether or not an applied compare data value matches a stored data value. Pseudo-VSS line 104 can provide an electrically isolatable potential node—and thus, can be distinguished from a conventional power supply node, such as VSS.

In FIG. 1, match line 102 and pseudo-VSS line 104 can be provided by an array of memory cells. In the particular example of FIG. 1, the MATCH and pseudo-VSS (PVSS) signals are provided by an array of content addressable memory (CAM) cells, with each CAM cell being connected to a corresponding match line. Thus, in FIG. 1, CAM array 106 can include a number of CAM cells 108-0 to 108-N. Each CAM cell (108-0 to 108-N) may include a compare stack 110 that can selectively provide a relatively low impedance path between match line 102 and pseudo-VSS line 104 according to match data values and compare data values in the case of "binary" CAM cells, and additionally, according to mask data values in the case of "ternary" CAM (TCAM) cells.

Many varieties of TCAMs exist, such as Mask-Value TCAMs (which usually contain three NMOS transistors in series in a compare stack), X-Y TCAMs (which usually contain two NMOS transistors in series in a compare stack), pseudo ternary TCAMs, etc. The construction of these TCAMs varies but can serve the same purpose of enabling or disabling a low impedance path in response to a compare result.

For instance, a Mask-Value Ternary CAM may include a data bit, a mask bit, and a compare data bit. In a Mask-Value TCAM, the data bit may come from a RAM, and the mask bit may come from another RAM within a TCAM cell. Another example of a Ternary CAM is the X-Y type, where the encoded X bit is stored within one RAM and the encoded Y bit data is stored within another RAM of the TCAM cell. The ternary bits, in this case, are X data, Y data, and compare data. The particular embodiments used herein use an X-Y type TCAM in the compare stacks.

The particular compare stack 110 shown in FIG. 1 is a NOR stack. A NOR stack can include a logic circuit that provides a NOR, or NOR-like function, such as an XNOR type function. Compare stack 110 can receive data values X and Y as inputs, as well as compare data values CD and BCD. In some cases, data values (X and Y) may be provided by one or more random access memory (RAM) cells 112, or the like. In the case of a ternary CAM device, one RAM cell can provide an X data value while the other RAM cell provides a Y data value. However, in the case of a binary CAM device, only one RAM cell may be included to provide complementary values X and Y. Of course, other storage structures could provide a data and/or mask value including, but not limited to, ROM or other types of storage elements. Compare data values (CD and BCD) can be complementary values that may be supplied to a CAM cell for a compare operation.

Sense amplifier 100 can be coupled to match line 102 and pseudo-VSS line 104 for comparing the match line potential to a potential on the pseudo-VSS line, and for generating a match indication (i.e., a HIT) or mismatch indication (i.e., a MISS) in response thereto. For example, sense amplifier 100 may generate a match indication when the match line varies in potential from the pseudo-VSS line. Various examples of sense amplifier circuits with pseudo-VSS arrangements are disclosed in application Ser. Nos. 10/873,608, now U.S. Pat. No. 7,084,672, issued on Aug. 1, 2006 entitled "Sense Amplifier Circuit for Content Addressable Memory Device," and 10/930,539, entitled "Sense Amplifier Architecture for Content Addressable Memory Device." The above-mentioned patent applications share a common assignee with the present invention and are incorporated herein in their entirety.

Figure 2:
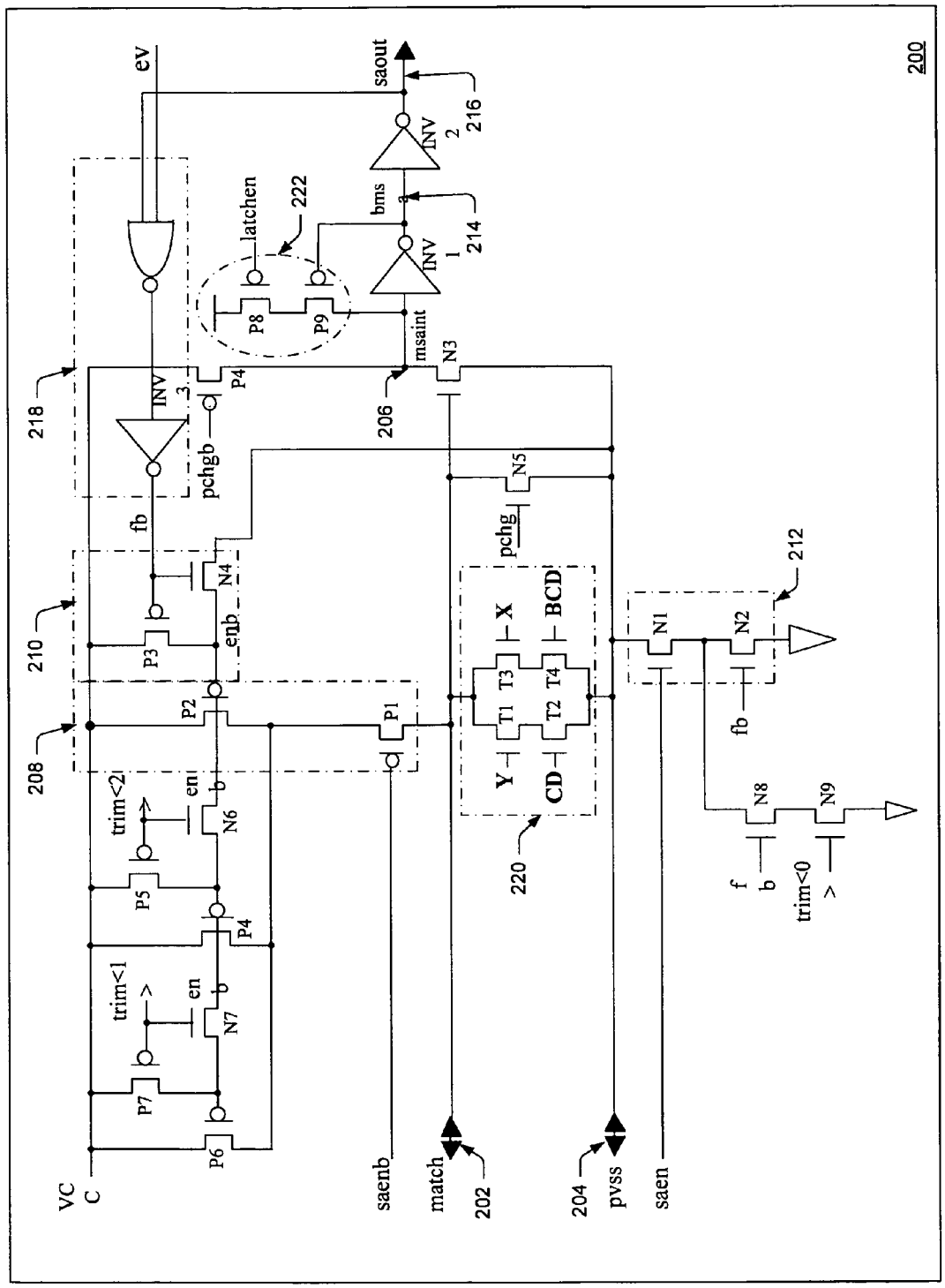
FIG. 2 is a circuit diagram of a sense amplifier circuit according to an embodiment.

A sense amplifier circuit according to one embodiment is set forth in FIG. 2, and designated by the general reference character 200. In general, sense amplifier 200 may be coupled to at least a portion of a memory array, such as CAM cell portion 220. In the embodiment of FIG. 2, CAM cell portion 220 includes a CAM cell compare stack and is situated between match line 202 and PVSS line 204. It is understood that multiple such compare stacks can be arranged between match line 202 and PVSS line 204. In addition, although a particular compare stack configuration is shown in FIG. 2, other compare stack configurations may be appropriate in other embodiments of the invention.

The particular compare stack shown in FIG. 2 includes transistors T1, T2, T3 and T4. Transistors T1 and T2 have source-drain paths arranged in series with one another between match line 202 and PVSS line 204. Transistors T3 and T4 also have source-drain paths arranged in series with one another, and in parallel with transistors T1 and T2. In the embodiment shown, transistors T1 and T3 receive encoded data values (X and Y) at their respective gates, while the gate terminals of a transistors T3 and T4 receive complementary compare data values (CD and BCD). In some cases, transistors T1, T2, T3 and T4 may be n-channel transistors.

As shown in FIG. 2, sense amplifier 200 may include a charge circuit 208, a feedback circuit 210, a discharge circuit 212, a p-channel pre-charging device P4, an n-channel sensing device N3, and an equalization device N5. In addition, sense amplifier 200 may be generally coupled for receiving a match line 202 and a pseudo-VSS (hereinafter PVSS) line 204 as inputs. As such, sense amplifier 200 may be configured to produce a sense operation result (msaint) at sense node 206, depending on a potential difference between match line 202 and PVSS line 204.

In some cases, sense amplifier 200 may include two inverters INV1 and INV2, which are arranged in series between sense node 206 and sense amplifier output node 216. In FIG. 2, for example, INV1 is coupled between sense node 206 and intermediate node 214, and thus, is configured for inverting the sense node signal (msaint) to produce intermediate output signal (bmsa). INV2 is coupled for receiving the intermediate output signal (bmsa) and for generating the sense amplifier output signal (saout) at output node 216. As described in more detail below, INV1 and INV2 may be included within the sense amp design to ensure that sense amplifier 200 is preset to a MISS state.

Charge circuit 208 includes a p-channel transistor P2 having a source-drain path arranged in series with another p-channel transistor P1. As shown in FIG. 2, p-channel transistor P1 may receive a sense amplifier enable signal (saenb) at its gate, while the gate of p-channel transistor P2 is connected to an enable node (enb). In this configuration, charge circuit 208 may generally function to provide a relatively low impedance path between match line 202 and a relatively high power supply voltage (e.g., VCC) during a sense operation.

Feedback circuit 210 includes p-channel transistor P3 and n-channel transistor N4. As shown in FIG. 2, p-channel transistor P3 may have a source-drain path connected between the enable node (enb) and the high power supply voltage (e.g., VCC). The gate of transistor P3 is coupled for receiving a feedback signal (fb), which is similar to the output signal (saout). The gate of n-channel transistor N4 is also coupled for receiving the feedback signal (fb). The source-drain path of transistor N4 is coupled between the enable node (enb) and PVSS line 204. In this configuration, feedback circuit 210 may generally function to disable the charging operation of charge circuit 208 in the event of a match result (i.e., if a "HIT" is detected).

In some cases, feedback control circuit 218 may be included to provide the feedback signal (fb) to feedback transistors P3 and N4, as well as transistor N2 in discharge circuit 212. In one embodiment, feedback control circuit 218 may include a NAND gate, whose inputs are coupled for receiving the sense amplifier output signal (saout) and a high voltage signal (ev), and a third inverter (INV3). As described in more detail below, the feedback signal (fb) may ensure that precharge transistor P2 and discharge transistor N2 are both turned off in the event that a "HIT" is detected. For example, a logic low entry valid (ev) indicating that the data is invalid may cause the feedback signal (fb) to switch off the P2 and N2 current sources. This isolates the match line 202 from the high power supply voltage (e.g., VCC) and PVSS line 204 from the low power supply voltage (e.g., VSS). In addition, feedback control circuit 218 may reduce current consumption by turning off the current paths through charge circuit 208 and discharge circuit 212.

Discharge circuit 212 includes n-channel transistors N1 and N2 having source-drain paths arranged in series between PVSS line 204 and a relatively low power supply voltage (e.g., VSS). As shown in FIG. 2, n-channel transistor N1 may receive a sense amplifier enable signal (saen) at its gate, while the gate of n-channel transistor N2 is coupled for receiving the feedback signal (fb). In this configuration, discharge circuit 212 may generally function to provide a relatively low impedance path between PVSS line 204 and the low power supply voltage during a sense operation.

In some cases, pre-charging device P4 may include a p-channel transistor with a source-drain path arranged between the high power supply voltage (e.g., VCC) and sense node 206. As shown in FIG. 2, pre-charging device P4 is coupled for receiving a complementary precharge signal (pchgb) at its gate. In response to the precharge signal, pre-charging device P4 may set the sense node (msaint) to a high potential (e.g., VCC), thereby presetting the sense amplifier to a MISS state (logic high, in this case). This is in contrast to conventional approaches that preset the sense node to a HIT state. However, by presetting the sense amplifier to a MISS state, current consumption can be decreased in typical applications, where almost all compared words result in a MISS. In other words, in a typical sense operation, almost all sense nodes will remain in the precharge state after sense amp evaluation, and none of the subsequent circuitry (e.g., INV1, INV2) corresponding to such unchanged nodes will switch. Current is saved by eliminating the need to continuously charge, discharge and recharge the sense amp when the sense node is preset to the HIT state.

In some cases, equalization device N5 may include an n-channel transistor with a source-drain path arranged between match line 202 and PVSS line 204. The gate of equalization transistor N5 is also coupled for receiving a precharge signal (pchg). In this manner, equalization device N5 may be configured for equalizing the potential between match line 202 and PVSS line 204 in response to the precharge signal (pchg). In one example, match line 202 and PVSS line 204 can be equalized to a potential of about ⅓ that of the high power supply (e.g., ⅓ VCC). In other words, when the CAM device operates at a power supply voltage of about 1 V, match line 202 and PVSS line 204 can each be equalized to about 300 mV.

Equalization can minimize power consumption in sense amplifier 200 by saving charge. For example, the match and PVSS lines would be discharged all the way to ground (instead of 300 mV) in the absence of equalization device N5. Equalization can also improves speed. For example, the sense amplifier is configured for detecting a difference between the match and PVSS lines. By equalizing to some level above ground, the separation speed between the match and PVSS lines is improved in cases where a HIT occurs (i.e., the PVSS line decreases in voltage potential at the same time that the match line is increasing in voltage potential).

In some cases, sensing device N3 may include an n-channel transistor with a gate connected to match line 202, a source connected to PVSS line 204, and a drain connected to sense node 206. Unlike conventional approaches, sensing device N3 can detect a match (HIT) result, as opposed to a mismatch (MISS) result. In addition, the sense amplifier design described herein and shown in FIG. 2 can improve upon conventional designs by using an n-channel sensing device, rather than a p-channel device. Because the threshold voltage of n-channel devices is typically lower over operating conditions and process variations than p-channel devices, n-channel sensing devices can enable faster sensing of a HIT state. As described below, faster sensing allows for faster operation of a CAM device and translates into lower current consumption, due to the advantageous feedback arrangement.

The operation of a sense amplifier 200 can be divided into a pre-sensing period and a sensing period. In some cases, the pre-sensing period can be about ¼ of a clock cycle, while the sensing period can be about ¾ of a sensing period. In the pre-sensing period, the active high sense amplifier enable signal (saen) transitions from high to low, turning off transistor N1 within discharge circuit 212, while the active low sense amplifier enable signal (saenb) transitions from low to high to turn off transistor P1 within charge circuit 208. At the same time, the active low precharge signal (pchgb) transitions from high to low, turning on pre-charge device P4, while equalization device N5 is turned on by the transition of the active high precharge signal (pchg) from low to high. Also in the pre-sensing period, complementary comparand lines CD/BCD are equalized, while bit lines BB1/BB2 can be discharged to a lower potential (e.g., VSS).

When pre-charge device P4 is turned on, the sense node (msaint) is precharged to a high level (e.g., VCC), constituting a MISS state. It is noted that the above arrangement can be repeated for all sense amplifier output nodes. Thus, according to the above arrangement, sense amplifier nodes can be preset to a MISS state (high in this case) by supplying the appropriate control signals to pre-charge device P4. This is in contrast to conventional approaches that preset sense nodes to a HIT state. Precharging the sense node to a MISS state can reduce power consumption by eliminating the need to continuously charge, discharge and recharge the sense amp when the sense node is preset to the HIT state (i.e., by saving current).

With equalization device N5 turned on, the potential of match line 202 and PVSS line 204 can be equalized to a low potential (e.g., ⅓ VCC). This is in sharp contrast to conventional approaches that precharge match lines to relatively high potentials (e.g., VCC) for subsequent discharge in the event of a mismatch.

At the end of the pre-sensing period, the sense amplifier enable signal (saen) may return to a high level (i.e., saenb goes low), turning on transistor N1 within the discharge circuit 212 and transistor P1 within charge circuit 208. At the same time, the active low precharge signal (pchgb) may transition to an inactive (i.e., high) level, turning off pre-charge device P4 and equalization device N5. This causes the sense node (msaint) to be isolated from the VCC potential, and match line 202 and PVSS line 204 to be isolated from one another by a row of CAM cells (represented by portion 220).

During the sensing period, the operation of sense amplifier 200 will vary according to whether the sensing operation detects a match (i.e., a HIT) or a mis-match (i.e., a MISS). In the event of a HIT, match line 202 remains essentially electrically isolated from PVSS line 204. As a result, match line 202 will begin to rise in potential due to the operation of charge circuit 208, while at the same time, the potential of PVSS line 204 falls. When the potential difference between match line 202 and PVSS line 204 exceeds the threshold voltage (Vtn) of sense transistor N3, transistor N3 will turn on to pull the sense node (msaint) to a lower potential. When the potential at the sense node exceeds the threshold of inverter INV1, inverter INV1 will drive the intermediate node (bmsa) high. This drives sense amplifier output node (saout) low, indicating a match (HIT) condition.

When the sense amplifier output node (saout) is driven low, feedback control circuit 218 generates a low feedback signal (fb) to turn on transistor P3 and turn off transistor N4 in feedback circuit 210, pulling the enable node (enb) high. As a result, transistor P2 in charge circuit 208 is turned off to isolate match line 202 from the high power supply (VCC). Likewise, transistor N2 in discharge circuit 212 is also turned off to isolate PVSS line 204 from the low power supply (VSS). Thus, match line 202 and PVSS line 204 are automatically isolated in the event of a HIT.

In the event of a MISS, match line 202 can become electrically connected to PVSS line 204 with minimum impedance. Thus, match line 202 and PVSS line 204 will essentially track one another in potential, maintaining the gate and source terminals of sense transistor N3 at essentially the same voltage. As a result, sense transistor N3 will remain turned off, and the sense node (msaint) can remain at the pre-set high potential. This, in turn, enables the intermediate node (bmsa) to remain low, while the sense amplifier output node (saout) remains high to indicate a MISS condition.

Advantages of sense amplifier circuit 200 can include, but are not limited to, reduced current consumption and faster sensing speed. For example, sense amplifier circuit 200 can reduce current consumption by adopting a charge sharing scheme between match and PVSS lines. In addition, sense amplifier circuit 200 utilizes a pre-charging device P4 to preset the sense amplifier to a MISS state, rather than a HIT state, thereby reducing current consumption by avoiding the need to continuously charge and discharge the match line. A faster sensing speed can also be provided by sense amplifier 200 by using an n-channel sensing device, rather than a p-channel device. In some cases, the improved sensing speed of the sense amplifier circuit may enable a memory device, such as a CAM, to operate at substantially higher operating speeds. Other advantages may become apparent in light of the disclosure set forth herein and the related applications mentioned above (U.S. Pat. No. 7,084,672, and Ser. No. 10/930,539).

Unfortunately, the performance of sense amplifier 200 may be limited by various factors including, variations in process, voltage and temperature (PVT) and current leakage in the sensing device. In some cases, the equalization scheme described above may limit the effective sensing speed of sense amplifier 200.

As noted above, the sense amp design described above can equalize the match and PVSS lines to the same voltage potential in the pre-sensing period, so that it may detect a relatively larger voltage separation between the match and PVSS lines if there is a "HIT", or a relatively smaller voltage separation if there is a "MISS," during the sensing period. A "MISS" occurs when at least one content value in the memory array does not match to the corresponding compare data. As shown in FIG. 2, for example, a "MISS" occurs when at least one conducting path exists between the match line 202 and PVSS line 204. Under the "MISS" condition, the separation between the match and PVSS lines should be minimum, so that the sense amplifier will detect a relatively small voltage (or no voltage) separation between the match and PVSS lines. This small voltage separation should not trip the subsequent stages INV1 and INV2, allowing the sense amplifier to maintain its pre-charged output in the "MISS" state.

A "HIT" occurs when at least one content value in the memory array matches with the compare data supplied thereto. In the current embodiment, a "HIT" will ideally only occur when there is no conducting path between match line 202 and PVSS line 204. During the sensing period, sense amplifier 200 may detect a relatively large voltage separation between the match and PVSS lines. This enables the sense amplifier to switch its output from the pre-charged "MISS" state to a "HIT" state.

In some cases, the sense amplifier design described above may not adequately detect certain compare results, particularly when attempting to sense a 1-bit "MISS" (i.e., a condition that occurs when only one bit mismatch occurs in a row). For example, even though sensing device N3 may be implemented as a minimum channel length/width device, sensing device N3 may still suffer from an undesirably high leakage current (due to leakage and mismatch among all sensing devices and the small voltage separation between match and PVSS lines). If too much current is leaked during a 1-bit "MISS," the sense node voltage (msaint) may be reduced to ultimately switch the sense amplifier output signal (saout) from a "MISS" to an erroneous "HIT" state. This is especially likely if the n-channel sensing device (N3) is fast, i.e., where the transistor threshold voltage is less than the nominal Vtn. It is understood, however, that a sensing device N3 with larger channel width and larger channel length may be used to not only reduce leakage, but also to reduce the mismatch among all N3 sensing devices in all the match sense amplifiers (MSAs).

Therefore, an optional "half latch" may be added to sense node 206, in some embodiments of the invention, to keep the sense node at its pre-set high level when sensing a 1-bit "MISS." As shown in FIG. 2, for example, an optional half latch 222 (i.e., a weak half latch) may be added between sense node 206 and intermediate node 214. In one embodiment, half latch 222 may include p-channel transistors P8 and P9 having source-drain paths coupled in series between a power supply voltage (e.g., VCC) and sense node 206. The gate of transistor P8 may be coupled for receiving a latch enable signal (latchen), while the gate of transistor P9 is connected to intermediate node 214.

Once sense node 206 is pre-set to the logic high value (i.e., a MISS state) during the pre-sensing period, the half latch is turned on to ensure that the sense node signal (msaint) remains at its pre-set level. If a "HIT" is detected during the sensing period, a large voltage separation between the match and PVSS lines will turn on sensing device N3, and the sense node signal (msaint) will be discharged to a logic low level, indicating a "HIT". If one or more bits are mismatched during the sensing period, the sense node signal will remain at the pre-set high level, indicating a "MISS". However, during a 1-bit "MISS", a voltage separation of approximately 200 to 250 mV between match line 202 and PVSS line 204 may cause sensing device N3 to leak. Without the half latch, too much current may leak from sensing device N3, thereby lowering the sense node voltage and switching the sense amplifier output state from a "MISS" to a "HIT," causing an erroneous match result. The half latch helps to reduce erroneous results by keeping the sense node at its pre-set high level during a 1-bit "MISS."

In some cases, the effective sensing speed of sense amplifier 200 may be reduced by the above-mentioned equalization scheme and/or by variations in PVT. For example, the "HIT" detection speed of sense amplifier 200 is generally limited by the ratio between the maximum current provided by the sense amplifier current source (e.g., charge circuit 208) and the minimum current allowed to pass through one conducting path between the match and PVSS lines. In some cases, the equalization scheme and/or PVT variations may cause some process corners to downbin (i.e., be classified according to performance) to lower operating speeds.

To compensate for fabrication process variations, optional trim bits can be typically added to sense amplifier 200, as shown in FIG. 2. For example, one or more p-channel current sources (e.g., P4/P5, P6/P7) could be added between VCC and the drain terminal of pre-charge transistor P2. If included, the p-channel current sources may be controlled by one or more trim bits (e.g., trim<2:1>) via one or more n-channel devices (e.g., N6, N7). In some cases, an n-channel current leaker (N8) may also be added between the source of transistor N1 and ground. As shown in FIG. 2, the n-channel current leaker may be controlled by an additional trim bit (e.g., trim <0>) via another n-channel device (N9). All trim bits may be selected for turning on/off the p-channel current source(s) and n-channel current leaker, depending on the electrical parameters of each fabrication lot during wafer testing. For instance, one or more p-channel current sources could be turned on, allowing the match line to be charged faster without compromising the functionality of the sense amplifier. If included, the optional trim settings may improve the sense amplifier performance across all process corners.

In particular, the optional trim settings may improve the effective sensing speed of sense amplifier 200. For example, the optional trim bits may be used to tune a current source (or sources) and a current leaker, as described above in reference to FIG. 2. For a slow PMOS and a fast NMOS process, trim<1> and/or trim<2> might be activated to enable an additional PMOS current source (e.g., P4 and P6), in addition to the default current source P2. The additional current will help to charge up match line 202 in a similar rate to the rate at which the strong NMOS current leaker (e.g., N9) discharges the PVSS line. In this manner, a faster sensing speed may be obtained without compromising the functionality of a 1-bit "MISS" detection. On the other hand, if the silicon falls into a fast PMOS and slow NMOS process, the NMOS leaker (N8) might be activated to compensate for the slow leaker, which may otherwise cause deficiencies in speed and/or functionality.

However, using trim bits to adjust process variation can be a costly back-end testing process. As state-of-art technology advances into the sub-0.1 µm range, the electrical parameter variations across a wafer, or even a die, may become large. Because of this, it can be increasingly difficult to tune a wafer or die with trim bits.

FIGS. 3-9 illustrate exemplary embodiments of an improved sense amplifier circuit that can simplify the back-end testing process by eliminating the need for trim bits. To do so, the various embodiments set forth below replace the p-channel current source with an n-channel device (e.g., NMOS or any other kind of NFET device). In addition to eliminating trim bits, the current embodiments may reduce the occurrence of erroneous sense results by implementing the current sources, compare stacks, sensing devices and leakers all with the same type of device (i.e., NFETs).

For example, in the sense amplifier circuits described above, the X-Y TCAM cell compare stacks may include a number of NFETs with very narrow channel width and short channel length. They are shown in the drawings as T1, T2, T3, and T4. If content of encoded X matches with compare data CD, there will be no conducting path in either T1/T2 or T3/T4. A "HIT" is detected when every content X<M:0> in a row of memory cells matches with its compare data CD<M:0>. If at least one bit mismatches, e.g. CD<0> does not match with X<0>, a conduction path will exist between either T1/T2 or T3/T4, which will allow current to flow from match line 202 to PVSS line 204. If a PMOS current source is used that is too strong and/or the compare stacks are too weak, the voltage separation between the match and PVSS lines might be big enough to turn on sensing device N3. In this manner, sensing device N3 may leak charge from sense node 206 (msaint), and as a result, may switch the sense amplifier output to a low level, indicating a false "HIT" (miss-sensing).

The proposed circuit schemes shown in FIGS. 3-9 can avoid miss-sensing by using an NFET, rather than PFET, current source. In most embodiments, the NFET current source may be implemented with one compare stack (T5/T6), which is substantially identical in size and layout to the TCAM compare stack (T1/T2, T3/T4). In other words, the NFET current source (T5/T6) may be chosen so that it will not supply too much or too little current to the match line. In doing so, the maximum current supplied to the match line may equal the maximum 1-bit MISS conducting current through any one of the TCAM compare stacks. The design concepts described herein may also eliminate erroneous sense results (e.g., when 1-bit MISS is miss-sensed as a "HIT") by implementing the current source, compare stacks, sensing device, and current leakers as NFET devices, thereby eliminating circuit sensitivity due to process variations between PFET, NFET and other process technologies. Therefore, even if the NFET devices are fabricated with different electrical characteristics, e.g., with different threshold voltages, the devices will track each other very well over process variations. For example, in a slow NMOS process, all of the NFETs will be slow with respect to one another.

Without trim bits, a sense amplifier circuit can become much simpler, the layout is simplified, die area is reduced, and manufacture and testing time can be greatly reduced (decreased time equals decreased cost). Though the sensing time may be slightly longer in the embodiments of FIGS. 3-9 (due to slow silicon process), erroneous sense results, such as those arising from a 1-bit MISS being sensed as a HIT, can be greatly reduced, if not eliminated.

Figure 3B:
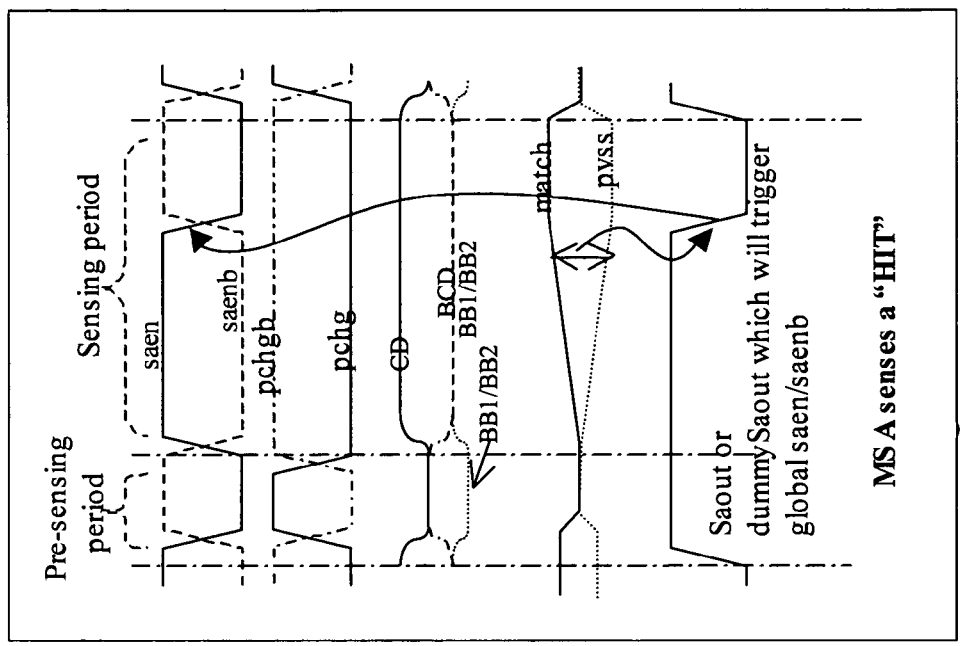
FIG. 3B is a timing diagram associated with the sense amplifier circuit shown in FIG. 3A.
Figure 3A:
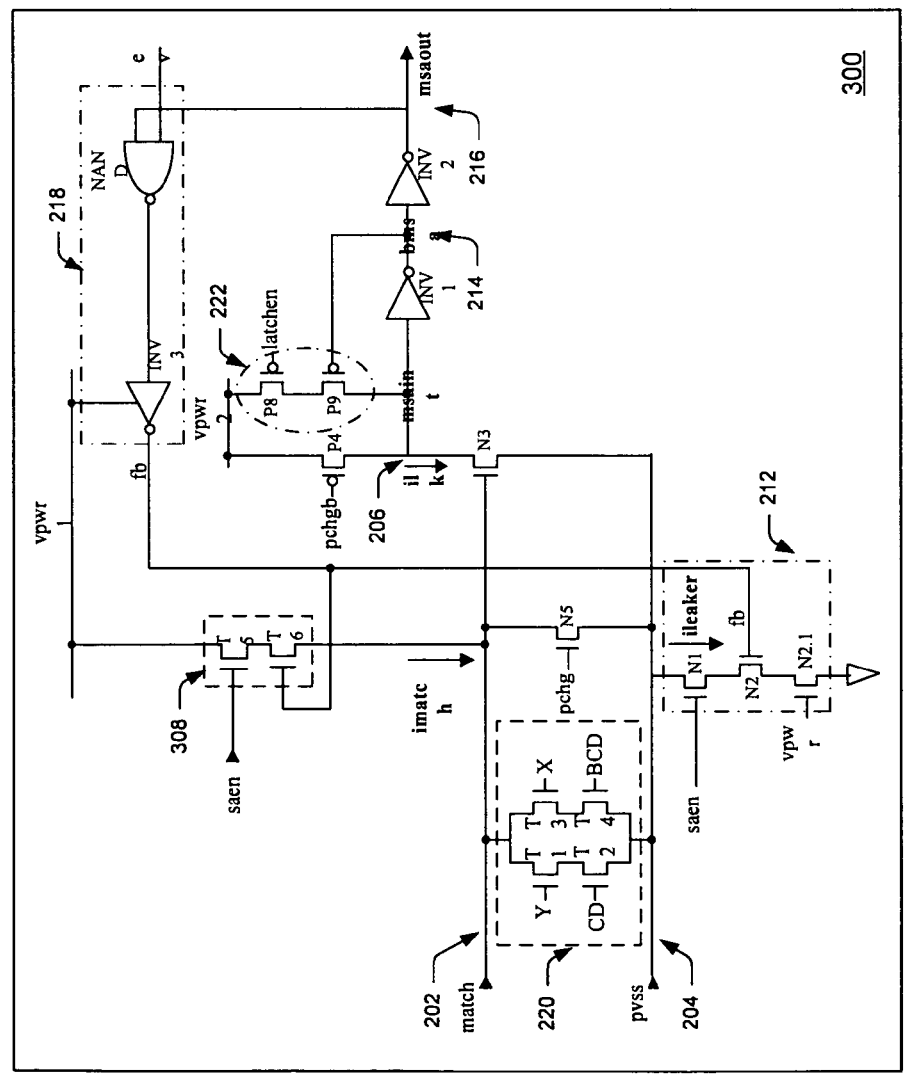
FIG. 3A is a circuit diagram of a sense amplifier circuit according to another embodiment of the invention.

FIG. 3A illustrates one embodiment of an improved sense amplifier circuit 300, which can eliminate the need for trim bits by implementing the current sources, compare stacks, sensing devices and leakers with devices of the same conductivity type, in this example all n-channel devices. Many of the circuit elements shown in FIG. 3A are identical to the circuit elements described above in reference to FIG. 2. Like elements are denoted with like reference numerals; the description of which will not be repeated for the purpose of brevity.

In general, sense amplifier circuit 300 can differ from sense amplifier circuit 200 by replacing the P1, P2, P3 and N4 transistors used within charging circuit 208 and feedback circuit 210 of FIG. 2 with an NFET compare stack (T5/T6) current source 308. As shown in FIG. 3A, the drain-source paths of compare stack T5/T6 may be coupled between a relatively high power supply voltage (e.g., Vpwr1) and match line 202. The gate of transistor T5 may be coupled for receiving the sense amplifier enable signal (saen), whereas the feedback signal (fb) may be supplied to the gate of transistor T6.

The operation of a sense amplifier 300 will now be described in conjunction with the timing diagram shown in FIG. 3B. During the pre-sensing period, the precharge signal (pchg) signal may equalize the match and PVSS lines to a relatively low voltage (e.g., ⅓ VCC), while the complementary precharge signal (pchgb) activates the pre-charging device P4 to charge the sense node (msaint) to a relatively high voltage (e.g., Vpwr1 or Vpwr2). Once the sense node is charged, the sense amplifier output will be pre-reset to the logic high (MISS) state. In addition, the feedback signal (fb) will activate one of the NFET current source devices (e.g., T6) and current limiting device N2. The sense enable signal (saen) will disable the other NMOS current source device (e.g., T5) and NFET current leaker N1.

During the sensing period, the precharge signal (pchg) transitions from high to low, turning off equalization device N5, while the complementary precharge signal (pchgb) transitions from low to high to turn off pre-charging device P4. At the same time, the sense enable signal (saen) transitions from low to high, turning on the current source T5/T6 and current leaker N1 paths. In the case of a "HIT," the match line voltage rises and PVSS voltage falls due to the absence of a conducting path between the match to PVSS lines. The separation voltage between match and PVSS lines is detected by sensing device N3. Once device N3 turns on, the previously stored (high) charge on the sense node (msaint) will be discharged and the subsequent logic states of INV1 and INV2 will change to output a logic low signal, indicating that a "HIT" has occurred. In the case of a "MISS," one or more conducting paths may exist between the match and PVSS lines. This enables the voltage of the match and PVSS lines to closely track one another at or near the pre-set high level, indicating that a "MISS" has occurred.

A worst case "MISS" detection is observed when only one bit mismatch occurs in a row. For example, the small voltage separation between the corresponding match and PVSS lines may cause sensing device N3 to leak charge (in the sub-threshold region), which may cause the sense amplifier to detect a false "HIT," instead of a 1-bit "MISS." Therefore, a weak half latch (P8 and P9) may be included in some embodiments of the invention to provide additional charge at the sense node to compensate for such leakage.

As described above, current leaker N2 may be implemented as a long channel current limiting device whose gate is controlled by the feedback signal (fb). In the embodiment of FIG. 3A, a new circuit scheme splits the current leaker into transistors N2 and N2.1, where N2 is a minimum size transistor and N2.1 is a long channel transistor with large gate area. This alteration reduces capacitive loading on the feedback signal, speeding up the feedback operation to save power.

Sense amplifier circuit 300 may be supplied with one or more relatively high power supply voltages. As shown in FIG. 3A, for example, sense amplifier circuit 300 may be supplied with a first power supply voltage (Vpwr1) and a second power supply voltage (Vpwr2). In one example, Vpwr1 may be a relatively higher supply voltage (e.g., about 1.2 V) and Vpwr2 may be a relatively lower supply voltage (e.g., about 1.0 V). As such, the higher supply voltage may be used in the front-end of the sense amplifier to gain headroom, while the lower supply voltage is used in the back-end to reduce transient current, and hence, reduce power consumption. In other embodiments, however, Vpwr1 and Vpwr2 may be substantially equal.

Figure 4:
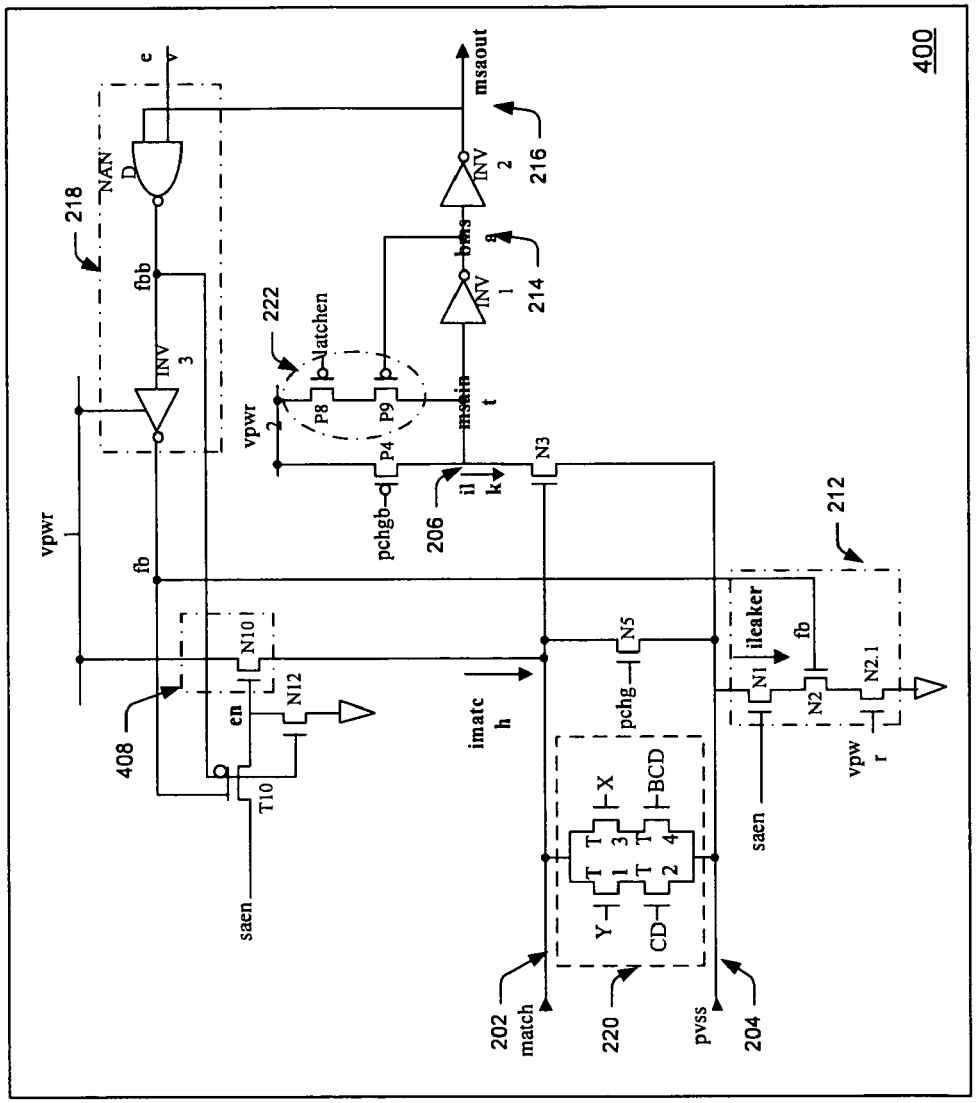
FIG. 4 is a circuit diagram of another sense amplifier circuit, according to a first alternative embodiment of the invention.
Figure 5:
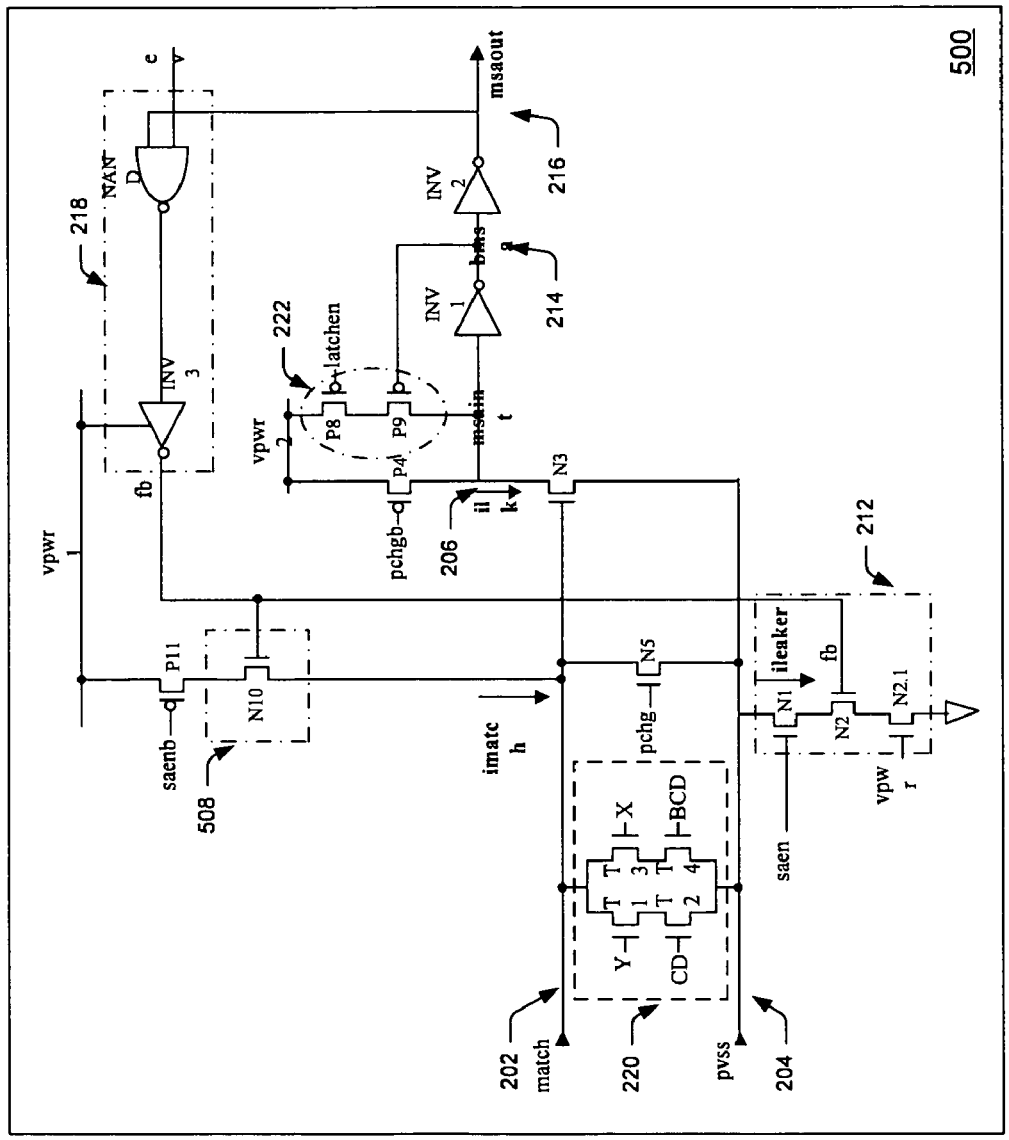
FIG. 5 is a circuit diagram of another sense amplifier circuit, according to a second alternative embodiment of the invention.
Figure 6:
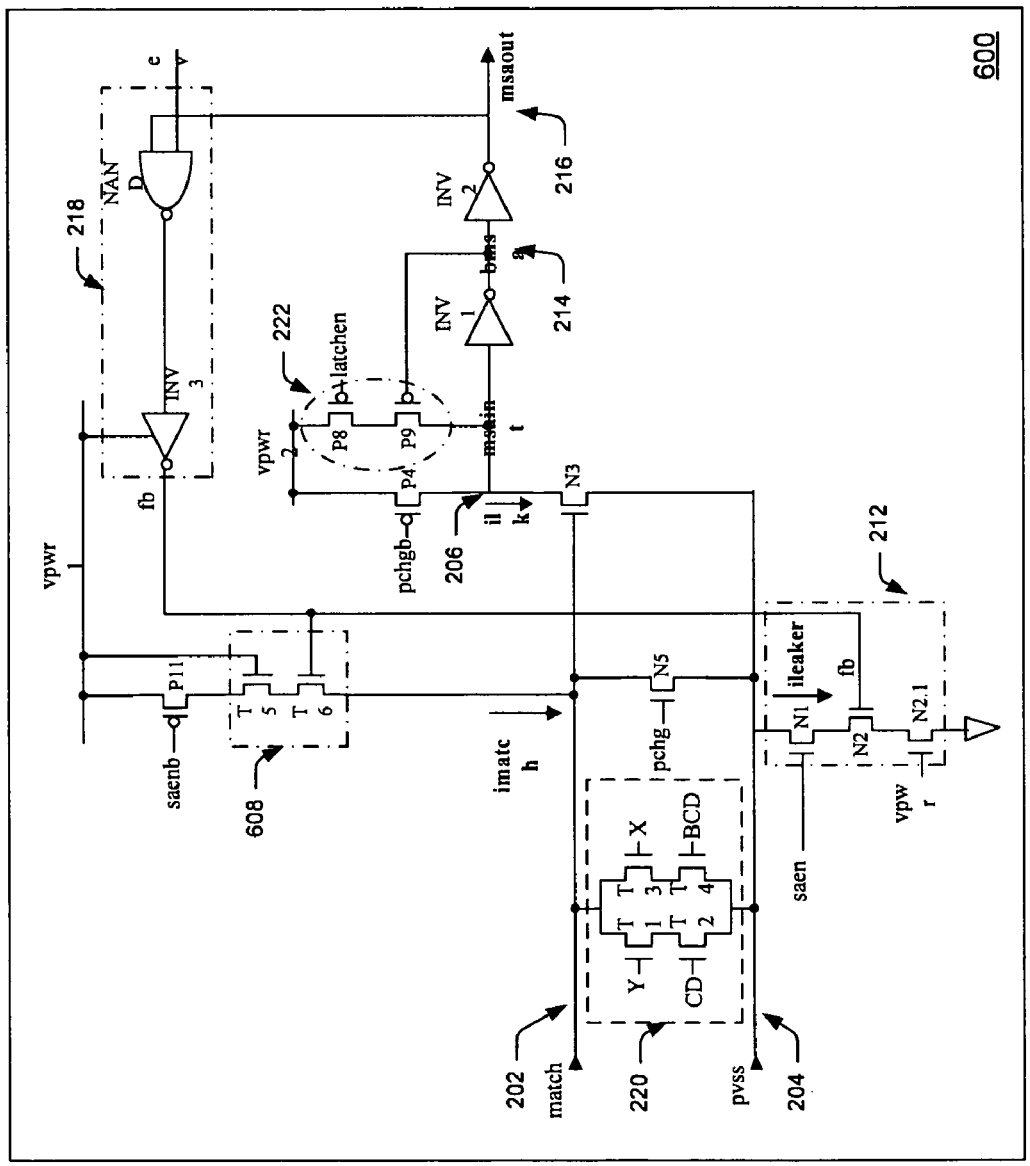
FIG. 6 is a circuit diagram of another sense amplifier circuit, according to a third alternative embodiment of the invention.

FIGS. 4-6 illustrate various alternative embodiments of sense amplifier circuit 300. In FIG. 4, for example, the compare stack based current source (T5/T6) is replaced with an n-channel transistor N10 to form charging circuit 408. In addition, a full transmission gate (e.g., p-channel and n-channel formed switch T10) is added and controlled by complementary feedback signals (fb, fbb). As shown in FIG. 4, transmission gate T10 may have a p-channel source and an n-channel drain coupled for receiving the sense enable signal (saen), a p-channel drain and an n-channel source coupled to the gate of transistor N10, a p-channel gate coupled for receiving the feedback signal (fbb), and an n-channel gate coupled for receiving the feedback signal (fb).

During the pre-sensing period, the fbb signal is reset to a low level for turning on the p-channel switch in gate T10 and turning off the N2 discharging device, while the fb signal is reset to a high level for turning on the n-channel switch in gate T10. During the sensing period, the sense enable signal (saen) transitions from low to high, causing the sense amplifier output signal (saout) to transition from high to low, in the case of a "HIT." The complementary feedback signals transition to an opposite logic state to turn off the full transmission switch T10 and turn on transistors N2 and N12. This pulls the enable node (en) to ground, turning off charging circuit 408.

The alternative embodiment shown in FIG. 4 takes advantage of the smaller threshold voltage and smaller leakage current of the single NFET current source (N10) within charging circuit 408. Because the threshold voltage of transistor N10 is substantially smaller than that of the compare stack based current source (T5/T6), transistor N10 experiences much less leakage current. In addition, the channel width and/or length of transistor N10 may be adjusted such that its drain-source current (Ids) is similar to that of the compare stack based current source (T5/T6). Therefore, in addition to providing all of the advantages described above (e.g., including no trim bits and tracking process variation), the architecture shown in FIG. 4 provides a much faster operating speed than the architecture described above and shown in FIG. 3.

In FIG. 5, the full transmission gate T10 and N12 device are removed and replaced with p-channel switching device P11 to simplify the control logic and reduce the number of devices in the front-end of the sense amplifier. As such, the configuration shown in FIG. 5 requires less layout area than the embodiments described above. In FIG. 5, a charging circuit 508, including NFET current source N10 and switching device P11, is inserted between VCC and match line 202. The gate of current source N10 is coupled for receiving the feedback signal (fb). In this embodiment, the current consumption may be reduced in feedback control block 218 since the gate loading is reduced. However, placing switching device P11 between VCC and the drain of N10 may reduce current consumption at the expense of headroom.

In FIG. 6, charging circuit 608 is formed by adding p-channel switching device P11 on top of the compare stack based current sources (T5/T6). The gate of transistor T5 is coupled to a relatively high power supply voltage (e.g., Vpwr1), while the gate of transistor T6 is coupled for receiving the feedback signal (fb). The configuration shown in FIG. 6 reduces leakage current caused by the narrow width of transistors T5/T6. However, adding p-channel switch P11 may sometimes reduce the amount of available headroom when the NMOS silicon is slow.

Figure 7B:
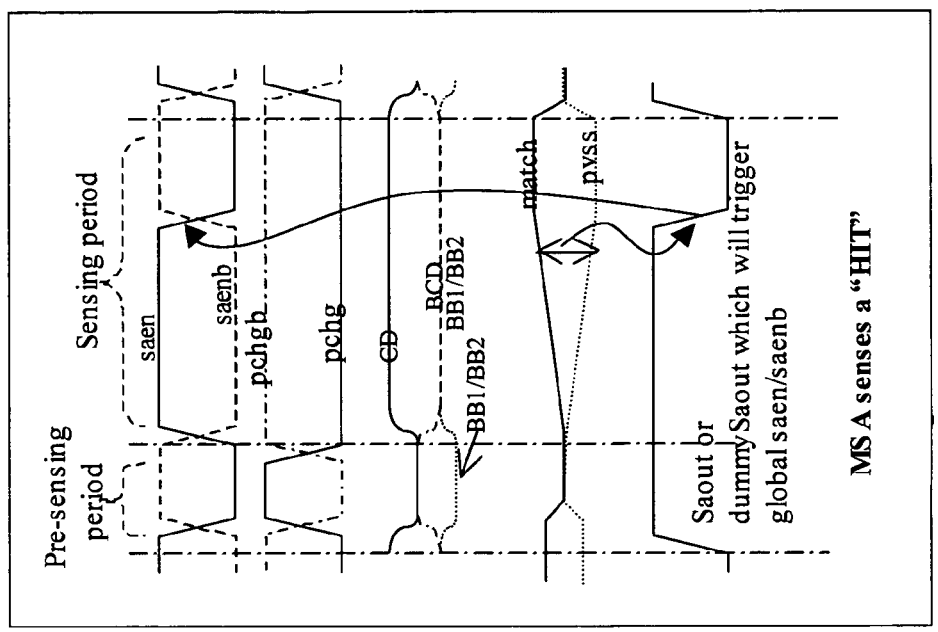
FIG. 7B is a timing diagram associated with the sense amplifier circuit shown in FIG. 7A.
Figure 7A:
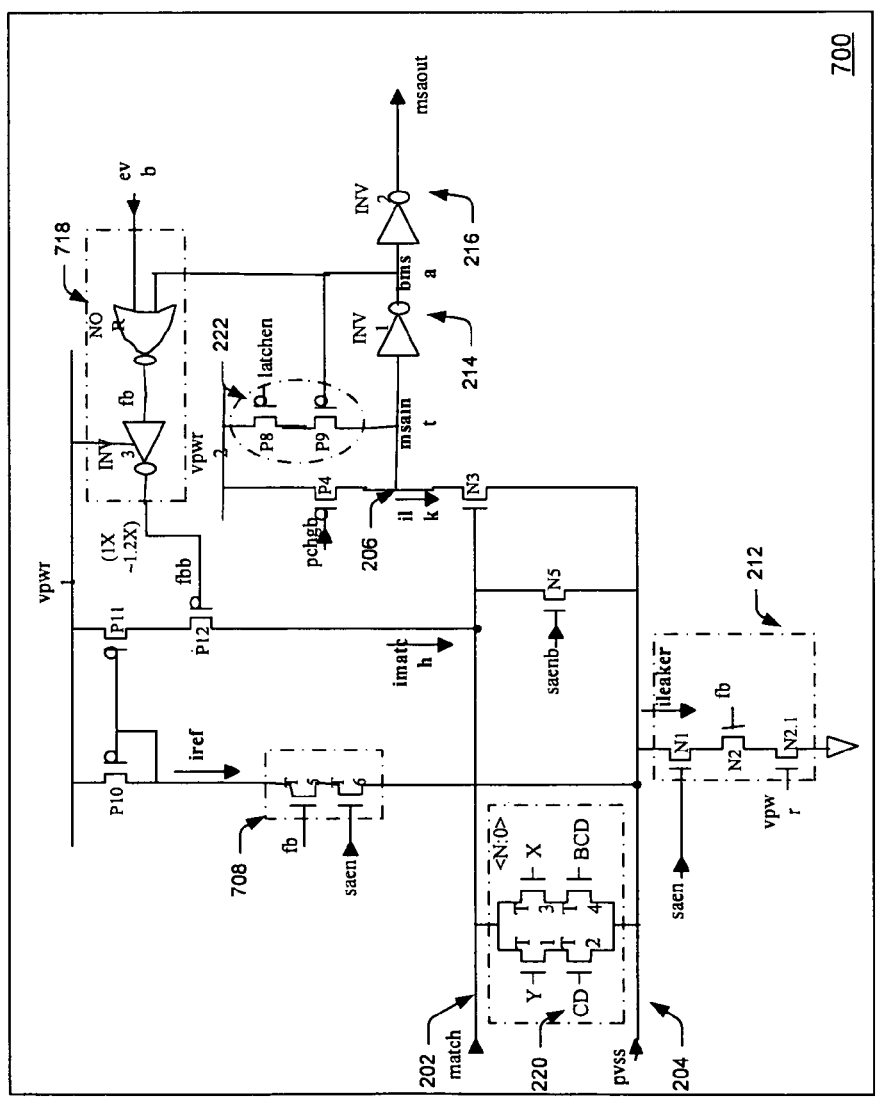
FIG. 7A is a circuit diagram of a sense amplifier circuit, according to a fourth alternative embodiment of the invention.
Figure 8:
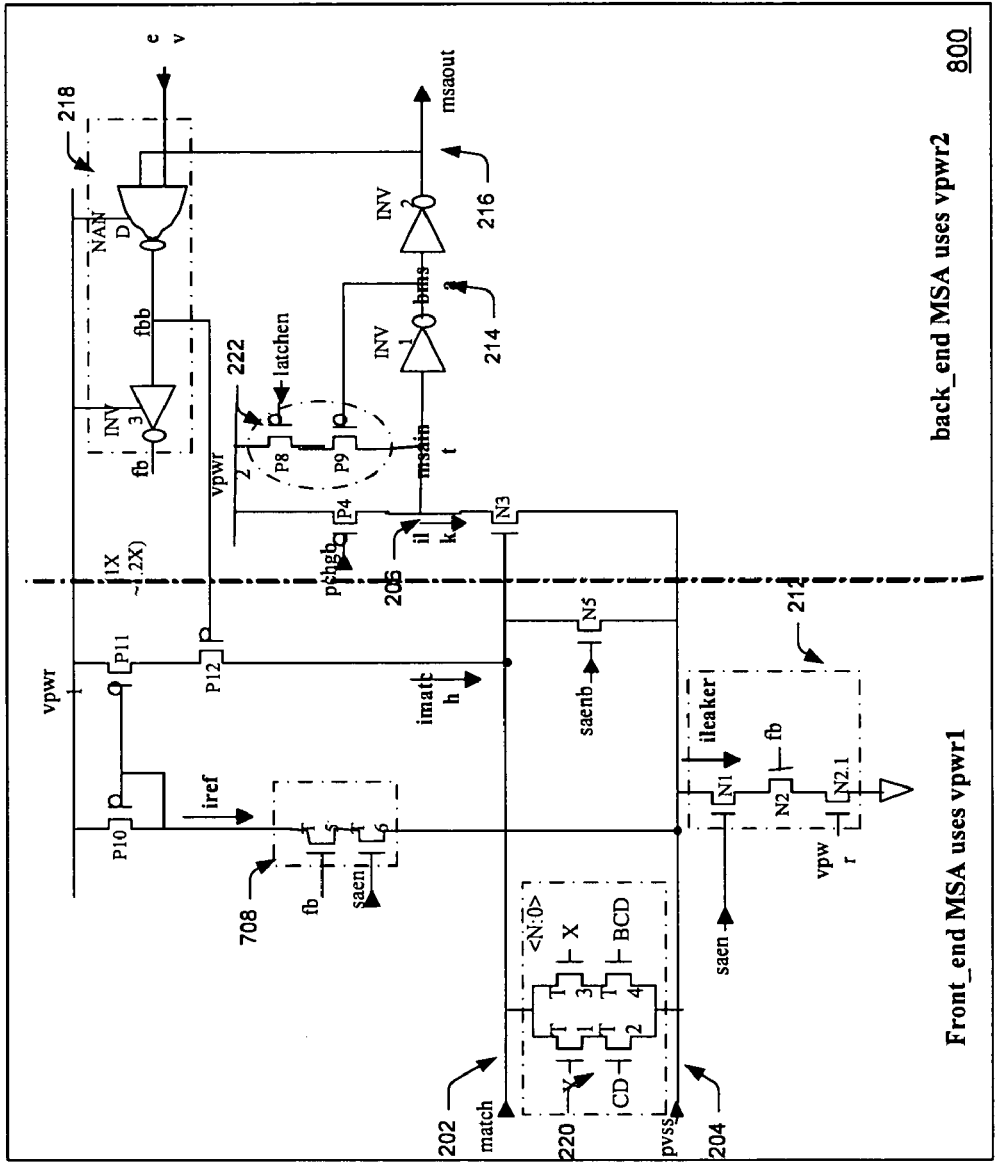
FIG. 8 is a circuit diagram of another sense amplifier circuit, according to a fifth alternative embodiment of the invention.
Figure 9:
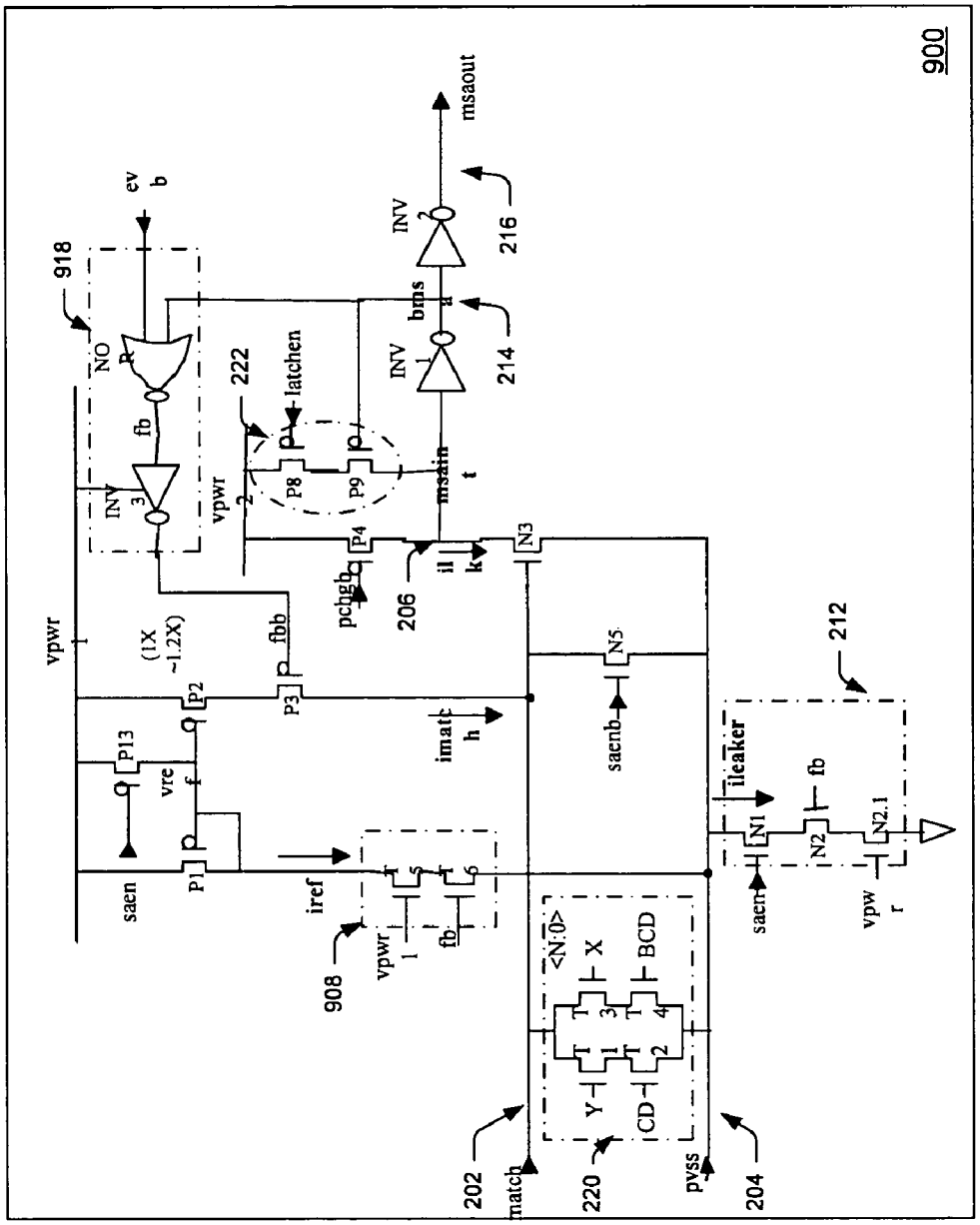
FIG. 9 is a circuit diagram of another sense amplifier circuit, according to a sixth alternative embodiment of the invention.
Figure 10:
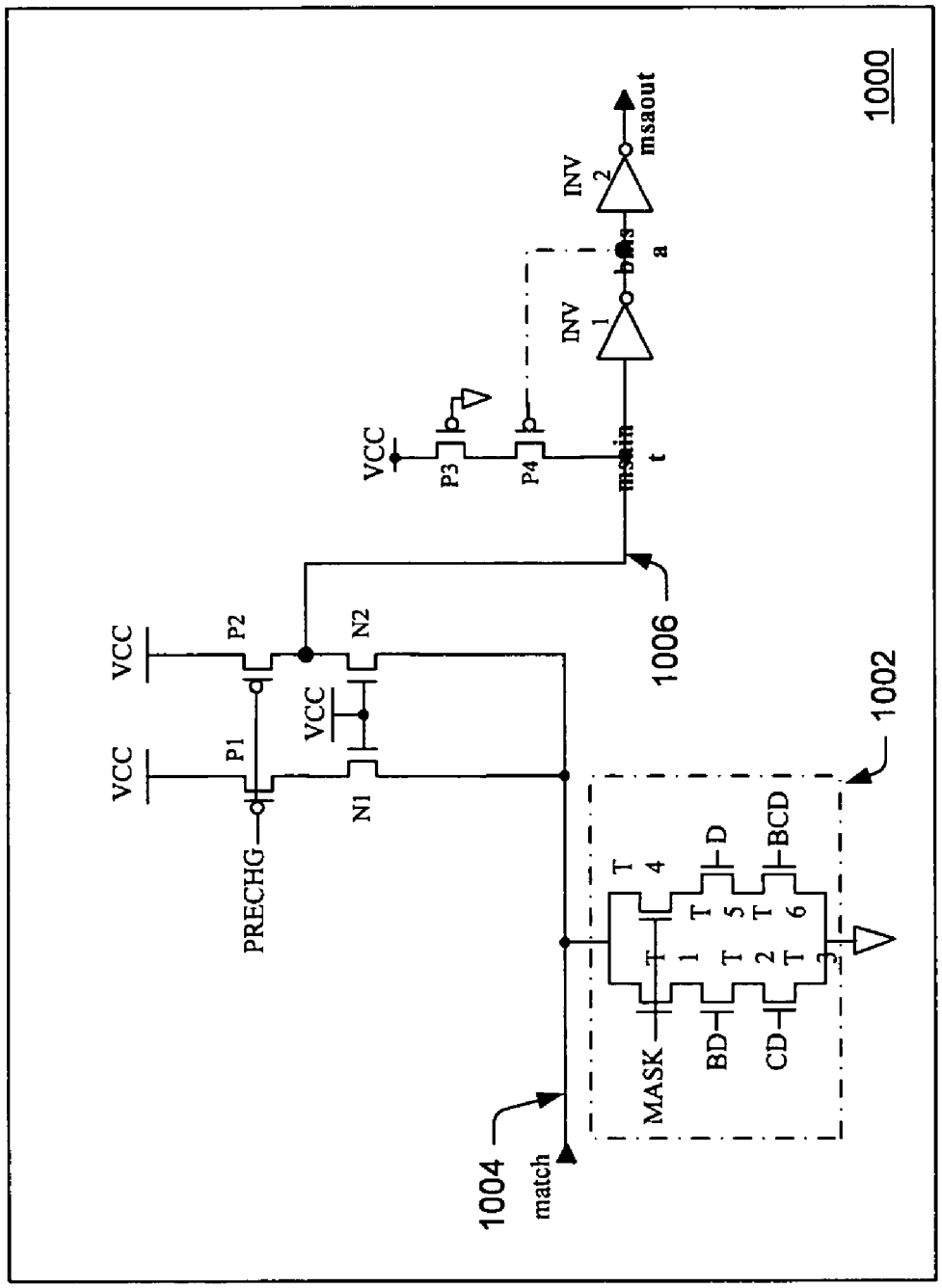
FIG. 10 is a circuit diagram of a conventional sense amplifier circuit.

FIGS. 7-9 illustrate further embodiments of an improved sense amplifier design that can have improved accuracy and reliability. Like FIGS. 3-6, the sense amplifier designs shown in FIGS. 7-9 can eliminate the need for trim bits by using an "all NFET" architecture. As such, the embodiments shown in FIGS. 7-9 provide many of the same advantages described above (e.g., simplified layout and reduced die area, back-end testing time and cost). Additional advantages will become apparent in light of the description below.

FIGS. 7-9 provide an alternative means for reducing circuit sensitivities to process variations without utilizing trim bits. Many of the circuit elements shown in FIG. 7A are identical to the circuit elements described above in reference to FIG. 3A. Like elements are denoted with like reference numerals; the description of which will not be repeated for the purpose of brevity.

In general, sense amplifier 700 differs from sense amplifier 300 by using a self-aligned, self-adjusting current source 708. The self-aligned, self-adjusting current source may include a current mirror formed by p-channel transistors P10 and P11, a compare stack T5 and T6, and a p-channel switching device P12, as shown in FIG. 7A. The compare stack T5/T6 is gated with a sense amplifier enable signal (saen) and a feedback signal (fb), while the switching device P12 is gated with a complementary feedback signal (fbb). As in previous embodiments, the feedback signals (fb, fbb) may be generated by feedback circuit 718. Unlike previous embodiments, the feedback circuit 718 shown in FIG. 7A can include a 2-input NOR gate and an inverter.

In FIG. 7A, the source-drain path of diode-connected P10 is coupled between a relatively high power supply voltage (e.g., Vpwr1) and compare stack T5/T6. In the other current mirror leg, the source-drain path of transistor P111, is coupled between the high power supply voltage and switching device P12. In this configuration, a reference current ($I_{ref}$) is generated through compare stack T5/T6 upon receiving enable signals from saen and fb. Since the compare stack device T6 is biased at PVSS (along with the compare stacks in the memory array), the amount of Iref conducting through T5/T6 can be identical to the current conducting through any one compare stacks in the memory array.

In another words, the reference current (Iref) may be substantially equal to the maximum amount of current conducting through one TCAM compare stack (e.g. T1/T2 or T3/T4). The reference leg biasing point of the current mirror can be essentially exactly the same as the TCAM array (i.e., PVSS line 204). As a consequence, the performance and behavior of the compare stack current source T5/T6 can be essentially identical to any compare stack in the TCAM array. Because compare stack current source T5/T6 can automatically track the performance of any compare stack in the TCAM array, the reference current (Iref) will be substantially equal to a single compare stack current in the case of a 1-bit "MISS."

Such current tracking can enhance the detection in the 1-bit MISS current case. In this way, the architecture shown in FIG. 7A may improve MSA performance in the event of a single bit "MISS" over conventional approaches having sensing transistors with some leakage current. If the p-channel current mirror (P10 and P11) are sized with a 1:1 ratio (e.g., if the length and width of transistors P10 and P11 are equal), the charging current (Imatch) can be essentially equal to the reference current (Iref). The use of such matching currents can enable the charging current (Imatch) supplied to match line 202 to tracks and align with one compare stack current; hence, the MSA can provide for accurate detection of a 1-bit "MISS" condition (i.e., Imatch provides the right amount of charge current that an array can handle under a 1-bit MISS condition.) Depending on process technology, the p-channel current mirror P10 and P11 can be sized with ratios between 1:1 and 1:1.2.

The operation of sense amplifier 700 will now be described in conjunction with the timing diagram shown in FIG. 7B. During the pre-sensing period, a complementary sense amplifier enable signal (saenb) is used to equalize the match and PVSS lines to a relatively low potential (e.g., ⅓ VCC), while a complementary precharge signal (pchgb) enables the pre-charging device P4 to charge the sense node (msaint) to relatively high potential (e.g., Vpwr2). Once the sense node is charged, the sense amplifier output signal (msaout) will assume a logic high state (i.e., a MISS state) via inverters INV1 and INV2.

As noted above, the match and PVSS lines may be equalized by turning on equalization transistor N5. In FIG. 7A, the equalization device is enabled by the complementary sense amplifier enable signal (saenb), instead of the precharge signal (pchg) used in the embodiments of FIGS. 3-6. The advantage of replacing the "pchg" signal with the "saenb" signal is that, in either "HIT" or "MISS" case, the sense amplifier enable signals (saen and saenb) will transition to their opposite states (after a required amount of time to detect a "HIT") to save power. For instance, the complementary sense enable signal (saenb) will transition from low to high to turn on equalization device N5 which, in turn, will equalize the match and PVSS lines to the same voltage potential. The sensing device N3 will also be turned off by a high saenb signal. In the case of a "HIT," the sense node (msaint) will remain at a low voltage potential until a new search cycle starts. In the case of a "MISS," and especially in the case of a 1-bit "MISS," the 0V gate-to-source voltage of sensing device N3 will ensure that any amount of drain-to-source current leakage is cut off, so that the sense node (msaint) will remain at its preset high voltage potential. Therefore, replacing the "pchg" signal with the "saenb" signal can further improve the robustness of the sense amplifier design.

As noted above, feedback circuit 718 generates a pair of complementary feedback signals (fb, fbb). The NOR gate inputs are taken from an internal node (bmsa), instead of the output node (saout) used in earlier configurations, and evb (where evb is a complimentary Entry Valid signal, which may be set to a logic low value to enable MSA operation). During the pre-sensing period, the feedback signal (fb) enables NMOS current source T5 and current limiting devices N2, while the complementary feedback signal (fbb) enables p-channel switching device P12 (even though transistor P12 is on, the Imatch current is off because Iref=0 uA during the pre-sensing period). In addition, a sense enable signal (saen) is supplied to NMOS current source T6 and NMOS leaker switch N1 for disabling those devices and turning off the $I_{ref}$ and $I_{leaker}$ paths (i.e., $I_{ref}+I_{match}=I_{leaker}=0$).

In addition to conserving power during the pre-sensing period, turning off the $I_{ref}$ and $I_{leaker}$ current paths functions to equalize the match and PVSS lines.

During the sensing period, the complementary sense amplifier enable signal (saenb) transitions from high to low to disable equalization device N5, while the complementary precharge signal (pchgb) transitions from low to high to disable pre-charging device P4. At the same time, the sense enable signal (saen) transitions from low to high to enable NMOS current source T6 and NMOS current leaker N1. A conducting current path therefore exists through T5/T6, and the reference current (Iref) flows through the current source compare stack T5/T6 mimicking the maximum current through any one of the compare stacks in the memory array (e.g. T1/T2 or T3/T4). The reference current is then mirrored to Imatch through the p-channel current mirror. The charging current (Imatch) begins to charge match line 202, while the current leaker (N1) begins to discharge PVSS line 204. Because the current source compare stack T5/T6 is biased in the same manner as the rest of the array (e.g., all compare stacks are biased with respect to the PVSS voltage potential), the reference current (Iref) produced through the T5/T6 compare stack enables the T5/T6 compare stack to behave in essentially the exact same way as the compare stacks in the memory array. Because compare stack current source T5/T6 automatically tracks the performance of any compare stack in the TCAM array, functional failures may be reduced (or even eliminated) in the embodiment of FIG. 7A.

For instance, if the regional threshold voltage shifts due to process variation, causing the compare stack devices to be slower, the reference current (Iref) will track such changes and produce less current (e.g., Iref will be smaller). Since Imatch is always aligned to the Iref, Imatch will also be smaller, which in turn, provides less charging current to match line 202. The net-effect is that less current will be provided to the match line and operation will be slower (due to, e.g., the larger threshold voltage of the compare stack devices), but 1-bit "MISS" detection can be accomplished with greater reliability. (Generally, a 1-bit "MISS" failure occurs when too much charging current is provided to the match line, and under a 1-bit MISS condition, the single conducting path cannot conduct the right amount of charging current, causing a larger separation between the match and PVSS lines, thereby tripping the sensing device and mis-sensing a "MISS to a "HIT".)

In the case of a "HIT," the charging current (Imatch) from charging circuit 708 will charge match line 202 to a high voltage potential (due to there being no conducting path between the match and PVSS lines) and discharge PVSS line 204 to a lower voltage potential. The large separation between the match and PVSS lines will cause the sensing device to trip and discharge the sense node (msaint) to a low voltage potential. The sense amplifier output will transition from high to low indicating that a "HIT" has occurred. If the PVSS line is discharged below the equalization voltage of approximately 300 mV (e.g., to 150 mV), the TCAM device at the bottom of the compare stack may begin to leak. In some cases, such leakage may cause the match line to charge up a bit slower.

However, one advantage of using current source 708 is that the positive feedback mechanism begins to kick in as the PVSS line is discharged to a relatively lower voltage potential. In other words, the lower PVSS voltage potential causes the compare stack current sources T5/T6 to have a larger drain-to-source voltage which, in turn, increases the reference current (Iref) to compensate for leakage in the compare stack in the memory array. The sensing speed of sense amplifier 700 is, therefore, can be preserved by the positive feedback mechanism.

A "MISS" occurs when at lease one compare stack in the memory array mismatches between encoded value and compare data. A worst case scenario occurs when only one 1-bit mismatches in an array. The reference current (Iref) is mirrored as Imatch begins to charge up the match line. This single conducting path between the match and PVSS lines will allow the charges to pass through and clamp the match and PVSS lines close together. Because the reference current (Iref) tracks the performance and behavior of the compare stacks in the memory array, the reference current will automatically adjust and provide the right amount of current to the match and PVSS lines (i.e., Iref=Imatch=the amount of current through one of the TCAM compare stacks). When a 1-bit mismatch occurs, the source-drain current (Ids) through the single conducting path will always be equal to Imatch. Therefore, the voltage separation between match and PVSS is limited and single bit MISS failure can be greatly reduced if not eliminated.

Sense amplifier 700 can improve the sensing speed in some skewed process corners (e.g., in slow PMOS and fast NMOS processes) and reduce the probability of a mis-sensing a 1-bit "MISS" by utilizing a current mirror to supply just enough charge current to the match line (i.e., the amount of current that one compare stack can handle). For example, the performance of sense amplifier 200 often suffers in the presence of skewed process corners. In the case of a slow PMOS wafer, the slow PMOS current generated by charging circuit 208 may not provide fast n-channel devices (such as those used in the compare stacks) with enough current. In addition, fast TCAM devices in the compare stack can tend to leak more current. This may cause the match line to be charged up very slowly in case of a "HIT," thereby reducing the sensing speed in the case of a "HIT." On the other hand, for a fast PMOS and slow NMOS wafer, PMOS current may provide too much current to match line 202 causing the sense amplifier to mis-sense a one-bit "MISS" and a "HIT."

The current mirror current source 708 shown in FIG. 7A can provide an amount of current to match line 202 that can enable sense amplifier 700 to detect one-bit "MISS" and "HIT" occurrences with improved speed and accuracy. In the embodiment shown, the reference current (Iref) is substantially equal to the source-drain current (Ids) through one current source compare-stack T5/T6, which in turn, behaves like any other compare stack in the memory array (such as T1/T2 or T3/T4). The mirrored current ($I_{match}$), which serves as the match line current source, is also essentially equal to one compare-stack current (due to the current mirror configuration). In this configuration, the current-mirror current source 708 will provide an optimal amount of current to the match line. That is, current source 708 will automatically track the performance of the compare stacks (e.g., in fast or slow processes) and adjust $I_{match}$ accordingly. As a result, no trimming process may be needed. In addition, a positive feedback mechanism in current source 708 adds "HIT" sensing advantage.

For example, current source 708 can be used to dynamically adjust $I_{match}$ when a "HIT" occurs. For example, the compare-stacks in a TCAM array may begin to leak (CD or BCD logic low may be near 0.3V, instead of 0V) when the match and PVSS lines separate and the PVSS line is discharged to a lower voltage potential. When this occurs, a larger $I_{match}$ may be needed to compensate for the current leakage within the TCAM compare-stacks. As shown in FIG. 7A, the current source compare stack transistors (T5/T6) and the TCAM compare stacks (T1/T2/T3/T4) are connected to the same PVSS line in the $I_{ref}$ path. Therefore, if the PVSS voltage from the TCAM compare stack decreases (due to leakage), the back-bias voltage through compare stack transistors T5/T6 will also decrease to lower the threshold voltage of transistors T5/T6 and increase $I_{ref}$. The mirrored current ($I_{match}$) will also increase by the same amount to compensate for leakage current in the TCAM array. Therefore, the positive feedback loop provided by current source 224 can prevent sense amplifier speed degradation caused by current leakage within the TCAM compare stacks.

In some embodiments, the size of transistor P11 can be manipulated to provide a greater or lesser amount of current to match line 202. In one example, the size of transistor P11 can be increased by 20% (e.g., from 1×-1.2×) to provide 20% more current to match line 202. In some processes, for example, the performance of the compare stack may be very good (e.g., the compare stack may demonstrate a small vt and large Ids). In these processes, the compare stack may be able to handle slightly more charge current without failing to detect a 1-bit MISS. Therefore, the size of transistor P11 may be increased by about 20% to provide 20% more current to match line 202. However, the size of transistor P11 is not limited to a 20% increase, and may be increased (or decreased) by smaller or larger amounts in alternative embodiments of the invention.

As in previous embodiments, sense amplifier 700 may be supplied with one or more relatively high power supply voltages (e.g., Vpwr1 and Vpwr2). In one example, Vpwr1 may be a higher supply voltage (e.g., about 1.2 V) than Vpwr2 (e.g., about 1.0 V). In some embodiments, the higher supply voltage may be used in the front-end of the sense amplifier to gain headroom, while the lower supply voltage is used in the back-end to reduce transient current and reduce power consumption. In other embodiments, however, Vpwr1 and Vpwr2 may be substantially equal.

FIGS. 8-9 illustrate alternative embodiments of sense amplifier circuit 700. In FIG. 8, the NOR gate used in FIG. 7A is replaced with a NAND gate in feedback circuit 218. The NAND gate serves, not only as a logic function, but also as a level shifter when Vpwr1>Vpwr2. For example, the NAND gate may select a higher PMOS threshold voltage (e.g., Vtp=0.6V, instead of 0.3V) when the voltage difference between Vpwr1 and Vpwr2 is less than about 0.3V. This enables control signals and feedback signals in the front-end of the sense amplifier to be at the same voltage level, even when Vpwr1 is not equal to Vpwr2. The embodiment shown in FIG. 8 avoids source-drain leakage caused by power supply variations.

In FIG. 9, one of the compare stack current sources (T5/T6) is gated with Vpwr1, instead of the sense amplifier enable signal (saen) used in previous embodiments. In addition, the feedback circuit 918 shown in FIG. 9 uses a NOR gate circuit scheme. In this scheme, the feedback signal (fb) output may be at a slightly higher voltage potential (Vpwr2) before entering INV3. INV3 functions as a level shifter to decrease the voltage potential of the complementary feedback signal (fbb) to a lower (Vpwr1) level. In this configuration, reference elements T5/T6 are gated to Vpwr1 and Vpwr2, which are equal to the DC supply voltages for the X and Y storage nodes in the TCAM cells and the compare data drivers (CD and BCD). In some cases, e.g., the TCAM array may use Vpwr1 and the CD/BCD drivers may use Vpwr2 (less power).

In addition, the sense amplifier enable signal (saen) is supplied to a PMOS control switch P13, which is coupled between Vpwr1 and the gate terminals of current mirror transistors P10 and P11. During the pre-sensing period, a logic low "saen" signal activates the control switch P13 to pull "vref" to Vpwr1 and turn off the current mirror. During the sensing period, a logic high "saen" signal disables the control switch P13 to allow the current mirror to provide a mirrored charge current (Imatch) to match line 202. The embodiment shown in FIG. 9 reduces the current leakage through compare stack current sources (T5/T6) during the pre-sensing period.

The embodiments shown in FIGS. 3-9 provide various sense amplifier designs that can have improved accuracy and reliability. In these previously disclosed embodiments, the proposed circuit schemes can replace the original p-channel current source (e.g., transistor P2 of FIG. 2) with a variety of n-channel current sources (e.g., compare stack T5/T6, as shown in FIGS. 3A and 6-9, or transistor N10, as shown in FIGS. 4-5). In addition, the proposed circuit schemes can reduce circuit sensitivities caused by process variations by implementing each of the current sources, compare stacks, sensing device, and current leakers with NFET devices. By using all NFET devices, the proposed circuit schemes can become more reliable and robust, while significantly reducing back-end testing costs by eliminating the need for trim bits.

In other words, the embodiments shown in FIGS. 3-9 improve the accuracy and reliability of the sense amplifier design by reducing circuit sensitivity to variations in fabrication process. Conventional sense amp circuits can be designed based on transistor models. If electrical parameter differences exist between actual silicon and transistor models, conventional "HIT" sense operations may become more difficult (if not impossible) to tune using a limited number of trim bits. The present invention provides an "all NFET" sensing circuit, and therefore, can remove the dependency of the sense amp circuit on variations between NMOS and PMOS fabrication processes.

In addition to the improvements shown in FIGS. 3-6, the embodiments shown in FIGS. 7-9 provide further means for improving sense amplifier accuracy and reliability without using trim bits. For example, the embodiments shown in FIGS. 7-9 use a self-aligned and self-adjusting current source (708) to automatically track the performance of the TCAM compare stack (which can vary with each fabrication process). The self-aligned and self-adjusting current source can provide just the right amount of current to the match line during the sensing period. In other words, the charging current (Imatch) is self-aligned with the reference current (Iref) which, in turn, tracks the drain-to-source current (Ids) through any of the compare stacks in the memory array. Because the self-aligned and self-adjusting current source is biased to the same voltage potential as the TCAM array (e.g., to PVSS), the current source provides a positive feedback path to compensate for current leakage in the TCAM compare stacks during a "HIT." For example, the positive feedback from the PVSS line enables the current source to automatically adjust the amount of current supplied to the match line. If leakage occurs in the TCAM compare stacks, the positive feedback may increase the amount of current supplied to the match line to compensate for such leakage without compromise the sensing speed. The self-aligned and self-adjusting current source can track process variations in the TCAM compare stack. In doing so, the architecture shown in FIGS. 7-9 can eliminate the need for trim bits, which are typically used for such purpose.

It will be appreciated to those skilled in the art having the benefit of this disclosure that this invention is believed to provide improved sense amplifier circuit designs having increased accuracy and reliability without the use of trim bits. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A sense amplifier circuit coupled to a match line for receiving a match line voltage and to a low potential line for receiving a low potential voltage from a memory array, wherein the sense amplifier circuit comprises:
   a charging circuit coupled between a power supply voltage and the match line voltage, wherein the charging circuit comprises no p-channel transistors;
   a discharging circuit coupled between the low potential voltage and a ground supply voltage; and
   an n-channel sensing device coupled for detecting a potential difference between the match line voltage and the low potential voltage.

2. The sense amplifier circuit as recited in claim 1, wherein the charging circuit comprises a pair of n-channel transistors with source-drain paths coupled in series between the power supply voltage and the match line voltage.

3. The sensing amplifier circuit as recited in claim 1, wherein the charging circuit comprises a single n-channel transistor with a source-drain path coupled in series between the power supply voltage and the match line voltage.

4. A sense amplifier circuit, comprising
   a compare section comprising a plurality of content addressable memory (CAM) cells that each include at least one transistor of a first conductivity type having a controllable impedance path coupled between a match line and an electrically isolatable line;
   a charge circuit coupled to the compare section that includes at least a first charge transistor of the first conductivity type with a controllable impedance path coupled between the compare section and a first power supply node;
   a discharge circuit, coupled between at least the electrically isolatable line and a second power supply node; and
   a sense circuit that activates a sense signal in response to a differential voltage between the match line and the electrically isolatable line.

5. The sense amplifier of claim 4, wherein:
   the charge circuit is coupled between the first power supply node and the match line.

6. The sense amplifier circuit of claim 5, wherein:
   the CAM cells each include two transistors or the first conductivity type having source-drain paths coupled in series with one another between the match line and the electrically isolatable line; and
   the at least first charge transistor includes a first charge transistor and second charge transistor of the first conductivity type having source-drain paths coupled in series with one another between the match line and the first power supply node.

7. The sense amplifier circuit of claim 5, wherein
   the sense circuit is coupled to a second power supply node and generates a sense signal that varies between the potential at the second power supply node and a third power supply node; and the first power supply node is coupled to receive a power supply voltage greater than that received at the second power supply node.

8. The sense amplifier circuit of claim 4, wherein:

the sense circuit generates a feedback signal having a first level in response to the sense signal having a first state and a second level in response to the sense signal having a second state; and the first charge transistor has a gate coupled to the feedback signal.

9. The sense amplifier circuit of claim 8, wherein:

the discharge circuit includes at least a first discharge transistor having a gate coupled to the feedback signal.

10. The sense amplifier circuit of claim 8, wherein:

the sense circuit further generates a complementary feedback signal that is the inverse of the feedback signal; and the charge circuit further includes a transmission gate circuit that couples an enable signal to the gate of the at least a first charge transistor, the transmission gate circuit including a first transmission transistor of the first conductivity type having a gate coupled to receive the feedback signal and a second transmission transistor of a second conductivity type having a gate coupled to receive the complementary feedback signal.

11. The sense amplifier circuit of claim 8, wherein:

the charge circuit further includes a charge enable transistor of a second conductivity type having a source-drain path coupled in series with a source-drain path of the at least first charge transistor.

12. The sense amplifier circuit of claim 11, wherein:

the charge circuit further includes a second charge transistor of the first conductivity type having a source-drain path coupled in series with a source-drain path of the at least first charge transistor, the second charge transistor having a gate coupled to the first power supply node.

13. The sense amplifier of claim 4, further including:

the charge circuit is coupled between the first power supply node and the electrically isolatable line; and a current mirror circuit formed from transistors of a second conductivity type having a first leg coupled to the source-drain path of the at least first charge transistor and a second leg coupled to the match line.

14. The sense amplifier of claim 13, wherein:

the current mirror circuit further includes an enable transistor of the second conductivity type having a source-drain path coupled between the first power supply node and the gates of the other transistors of the current mirror, and a gate coupled to receive an enable signal.

15. The sense amplifier circuit of claim 4, wherein:

the sense circuit generates a Feedback signal that varies between the potential at a first power supply node and a low power supply node; and the charge circuit further includes a second charge transistor having a gate coupled to a second power supply node and a source-drain path in series with a source-drain path of the first charge transistor; wherein the first power supply node is coupled to a receive a first power supply voltage different from a power supply voltage received at the second power supply node.

16. The sense amplifier circuit of claim 4, wherein:

the sense circuit includes a sense transistor of the first conductivity type having a gate coupled to the match line and a source coupled to the electrically isolatable line.

17. The sense amplifier circuit of claim 16, wherein:

the sense circuit includes sense logic that generates the sense signal according to the potential at the drain of the sense transistor, the sense logic driving the sense signal between a potential at a first power supply node and a low power supply node, and feedback logic that generates a feedback signal according to the sense signal, the feedback logic driving die sense signal between a potential at a second power supply node and the low power supply node, the second power supply node coupled to receive a larger power supply voltage than the first power supply node.

18. A sense amplifier circuit, comprising:

a compare section comprising a plurality of content addressable memory (CAM) cells coupled between a match line and an electrically isolatable line, wherein the electrically isolatable line is not a static ground line;

a sense circuit comprising a sense transistor of a first conductivity type with a gate coupled to the match line, a source coupled to the electrically isolatable line, a holding transistor of a second conductivity type having a source drain path coupled between the drain of the sense transistor and a first power supply node, and an inverting logic circuit having an input coupled to the drain of the sense transistor and an output coupled to the gate of the holding transistor.

19. The sense amplifier circuit of claim 18, further including:

each CAM cell includes at least a first cell transistor of the first conductivity type coupled between the match line and the electrically isolatable line;

a charge circuit that includes at least a first charge transistor of the first conductivity type having a source-drain path coupled to the match line; and a discharge circuit that includes at least a first discharge transistor having a source-drain path coupled between the electrically isolatable line and a reference supply node.

20. The sense amplifier circuit of claim 18, further including:

each CAM cell includes at least a first cell transistor of the first conductivity type coupled between the match line and the electrically isolatable line;

a charge circuit that includes at least a first charge transistor of the first conductivity type having a source-drain path coupled to the electrically isolatable line; and a current mirror circuit having a first leg coupled to the charge circuit and a second leg coupled to the match line.

* * * * *

UNITED STATES PATENT AND TRADEMARK OFFICE
CERTIFICATE OF CORRECTION

PATENT NO. : 7,362,602 B1 Page 1 of 1
APPLICATION NO. : 11/501584
DATED : April 22, 2008
INVENTOR(S) : Anita X. Meng and Hariom Rai It is certified that error appears in the above-identified patent and that said Letters Patent is hereby corrected as shown below:

IN THE CLAIMS
At column 21, line 52, Claim 15, please replace "Feedback" with --feedback-- so that the corresponding phrase reads – a feedback signal –.

Signed and Sealed this

Nineteenth Day of August, 2008

JON W. DUDAS
*Director of the United States Patent and Trademark Office*